(12) United States Patent
Mar et al.

(10) Patent No.: US 6,910,126 B1
(45) Date of Patent: Jun. 21, 2005

(54) PROGRAMMING METHODOLOGY AND ARCHITECTURE FOR A PROGRAMMABLE ANALOG SYSTEM

(75) Inventors: Monte Mar, Issaquah, WA (US); Warren Snyder, Snohomish, WA (US)

(73) Assignee: Cypress Microsystems, Inc., San Jose, CA (US)

( * ) Notice: Subject to any disclaimer, the term of this patent is extended or adjusted under 35 U.S.C. 154(b) by 444 days.

(21) Appl. No.: 09/930,021

(22) Filed: Aug. 14, 2001

Related U.S. Application Data

(60) Provisional application No. 60/243,708, filed on Oct. 26, 2000.

(51) Int. Cl.[7] .............................................. G06F 13/14
(52) U.S. Cl. .............................. 713/1; 713/2; 713/100; 710/100; 708/800; 708/801
(58) Field of Search ........................ 710/100; 713/100, 713/1, 2; 708/800, 801; 365/185.03; 455/560; 375/222; 327/334, 336

(56) References Cited

U.S. PATENT DOCUMENTS

| | | | |
|---|---|---|---|
| 5,202,687 A | | 4/1993 | Distinti ....................... 341/158 |
| 5,258,760 A | | 11/1993 | Moody et al. ............... 341/166 |
| 5,414,308 A | | 5/1995 | Lee et al. .................... 327/293 |
| 5,563,526 A | | 10/1996 | Hastings et al. .............. 326/37 |
| 5,574,678 A | * | 11/1996 | Gorecki ....................... 708/801 |
| 5,600,262 A | | 2/1997 | Kolze ........................... 326/38 |
| 5,905,398 A | * | 5/1999 | Todsen et al. ............... 327/337 |
| 6,141,376 A | * | 10/2000 | Shaw ........................... 375/222 |
| 6,144,327 A | | 11/2000 | Distinti et al. ............... 341/126 |
| 6,166,367 A | | 12/2000 | Cho .......................... 250/208.1 |
| 6,185,127 B1 | * | 2/2001 | Myers et al. ........... 365/185.03 |
| 6,225,866 B1 | | 5/2001 | Kubota et al. ............... 330/295 |
| 6,453,175 B2 | * | 9/2002 | Mizell et al. ................ 455/560 |
| 6,701,340 B1 | * | 3/2004 | Gorecki et al. ............. 708/801 |
| 6,714,066 B2 | * | 3/2004 | Gorecki et al. ............. 327/553 |

OTHER PUBLICATIONS

CYPR–CD00173; "A Programmable Analog System Architecture (as Amended)"; U.S. Appl. No. 09/909,047; filed Jul. 18, 2001; Mar.
CYPR–CD00175; "Method for Synchronizing and Resetting Clock Signals Supplied to Multiple Programmable Analog Blocks (as Amended)"; U.S. Appl. No. 09/969,311; filed Oct. 1, 2001; B. Sullam.
CYPR–CD00194; "Method and Apparatus for Local and Global Power Management in a Programmable Analog Circuit"; U.S. Appl. No. 09/935,454; filed Aug. 22, 2001; M. Mar.
CYPR–CD00232; "Programmable System on a Chip"; U.S. Appl. No. 10/033,027; filed Oct. 1, 2001; W. Snyder.

* cited by examiner

Primary Examiner—Rehana Perveen
(74) Attorney, Agent, or Firm—Wagner, Murabito & Hao LLP

(57) ABSTRACT

A method of programming a programmable analog device that introduces on a single chip a set of tailored analog blocks and elements that can be configured and reconfigured in different ways to implement a variety of different analog functions. The analog blocks can be electrically coupled to each other in different combinations to perform different analog functions. Each analog block includes analog elements that have changeable characteristics that can be specified according to the function to be performed. Configuration registers define the type of function to be performed, the way in which the analog blocks are to be coupled, the inputs and outputs of the analog blocks, and the characteristics of the analog elements. The configuration registers can be dynamically programmed. Thus, the device can be used to realize a large number of different analog functions and applications.

28 Claims, 52 Drawing Sheets

150a

| Reg Name | Addr | Reg Name | Addr | Reg Name | Addr | Reg Name | Addr |
|---|---|---|---|---|---|---|---|
| PRT0DR | 000 | RESERVED | 040 | ASA10CR0 | 080 | RESERVED | 0C0 |
| PRT0IE | 001 | RESERVED | 041 | ASA10CR1 | 081 | RESERVED | 0C1 |
| PRT0GS | 002 | RESERVED | 042 | ASA10CR2 | 082 | RESERVED | 0C2 |
| RESERVED | 003 | RESERVED | 043 | ASA10CR3 | 083 | RESERVED | 0C3 |
| PRT1DR | 004 | RESERVED | 044 | ASB11CR0 | 084 | RESERVED | 0C4 |
| PRT1IE | 005 | RESERVED | 045 | ASB11CR1 | 085 | RESERVED | 0C5 |
| PRT1GS | 006 | RESERVED | 046 | ASB11CR2 | 086 | RESERVED | 0C6 |
| RESERVED | 007 | RESERVED | 047 | ASB11CR3 | 087 | RESERVED | 0C7 |
| PRT2DR | 008 | RESERVED | 048 | ASA12CR0 | 088 | RESERVED | 0C8 |
| PRT2IE | 009 | RESERVED | 049 | ASA12CR1 | 089 | RESERVED | 0C9 |
| PRT2GS | 00A | RESERVED | 04A | ASA12CR2 | 08A | RESERVED | 0CA |
| RESERVED | 00B | RESERVED | 04B | ASA12CR3 | 08B | RESERVED | 0CB |
| PRT3DR | 00C | RESERVED | 04C | ASB13CR0 | 08C | RESERVED | 0CC |
| PRT3IE | 00D | RESERVED | 04D | ASB13CR1 | 08D | RESERVED | 0CD |
| PRT3GS | 00E | RESERVED | 04E | ASB13CR2 | 08E | RESERVED | 0CE |
| RESERVED | 00F | RESERVED | 04F | ASB13CR3 | 08F | RESERVED | 0CF |
| PRT4DR | 010 | RESERVED | 050 | ASB20CR0 | 090 | RESERVED | 0D0 |
| PRT4IE | 011 | RESERVED | 051 | ASB20CR1 | 091 | RESERVED | 0D1 |
| PRT4GS | 012 | RESERVED | 052 | ASB20CR2 | 092 | RESERVED | 0D2 |
| RESERVED | 013 | RESERVED | 053 | ASB20CR3 | 093 | RESERVED | 0D3 |
| PRT5DR | 014 | RESERVED | 054 | ASA21CR0 | 094 | RESERVED | 0D4 |
| PRT5IE | 015 | RESERVED | 055 | ASA21CR1 | 095 | RESERVED | 0D5 |
| PRT5GS | 016 | RESERVED | 056 | ASA21CR2 | 096 | RESERVED | 0D6 |
| RESERVED | 017 | RESERVED | 057 | ASA21CR3 | 097 | RESERVED | 0D7 |
| RESERVED | 018 | RESERVED | 058 | ASB22CR0 | 098 | RESERVED | 0D8 |
| RESERVED | 019 | RESERVED | 059 | ASB22CR1 | 099 | RESERVED | 0D9 |
| RESERVED | 01A | RESERVED | 05A | ASB22CR2 | 09A | RESERVED | 0DA |
| RESERVED | 01B | RESERVED | 05B | ASB22CR3 | 09B | RESERVED | 0DB |
| RESERVED | 01C | RESERVED | 05C | ASA23CR0 | 09C | RESERVED | 0DC |
| RESERVED | 01D | RESERVED | 05D | ASA23CR1 | 09D | RESERVED | 0DD |
| RESERVED | 01E | RESERVED | 05E | ASA23CR2 | 09E | RESERVED | 0DE |
| RESERVED | 01F | RESERVED | 05F | ASA23CR3 | 09F | RESERVED | 0DF |

| Reg Name | Addr | Reg Name | Addr | Reg Name | Addr | Reg Name | Addr |
|---|---|---|---|---|---|---|---|
| DBA00DR0 | 020 | AMX IN | 060 | RESERVED | 0A0 | INT MSK0 | 0E0 |
| DBA00DR1 | 021 | RESERVED | 061 | RESERVED | 0A1 | INT MSK1 | 0E1 |
| DBA00DR2 | 022 | RESERVED | 062 | RESERVED | 0A2 | INT VC | 0E2 |
| DBA00CR0 | 023 | ARF CR | 063 | RESERVED | 0A3 | RES WDT | 0E3 |
| DBA01DR0 | 024 | CMP CR | 064 | RESERVED | 0A4 | DEC DH OR D | 0E4 |
| DBA01DR1 | 025 | ASY CR | 065 | RESERVED | 0A5 | DEC DL | 0E5 |
| DBA01DR2 | 026 | RESERVED | 066 | RESERVED | 0A6 | DEC CR | 0E6 |
| DBA01CR0 | 027 | RESERVED | 067 | RESERVED | 0A7 | RESERVED | 0E7 |
| DCA02DR0 | 028 | RESERVED | 068 | RESERVED | 0A8 | MUL X | 0E8 |
| DCA02DR1 | 029 | RESERVED | 069 | RESERVED | 0A9 | MUL Y | 0E9 |
| DCA02DR2 | 02A | RESERVED | 06A | RESERVED | 0AA | MUL DH | 0EA |
| DCA02CR0 | 02B | RESERVED | 06B | RESERVED | 0AB | MUL DL | 0EB |
| DCA03DR0 | 02C | RESERVED | 06C | RESERVED | 0AC | ACC DR0 OR | 0EC |
| DCA03DR1 | 02D | RESERVED | 06D | RESERVED | 0AD | ACC DR1 OR | 0ED |
| DCA03DR2 | 02E | RESERVED | 06E | RESERVED | 0AE | ADD DR2 OR | 0EE |
| DCA03CR0 | 02F | RESERVED | 06F | RESERVED | 0AF | ADD DR3 OR | 0EF |
| DBA04DR0 | 030 | RESERVED | 070 | RESERVED | 0B0 | RESERVED | 0F0 |
| DBA04DR1 | 031 | ACA00CR0 | 071 | RESERVED | 0B1 | RESERVED | 0F1 |
| DBA04DR2 | 032 | ACA00CR1 | 072 | RESERVED | 0B2 | RESERVED | 0F2 |
| DBA04CR0 | 033 | ACA00CR2 | 073 | RESERVED | 0B3 | RESERVED | 0F3 |
| DBA05DR0 | 034 | RESERVED | 074 | RESERVED | 0B4 | RESERVED | 0F4 |
| DBA05DR1 | 035 | ACA01CR0 | 075 | RESERVED | 0B5 | RESERVED | 0F5 |
| DBA05DR2 | 036 | ACA01CR1 | 076 | RESERVED | 0B6 | RESERVED | 0F6 |
| DBA05CR0 | 037 | ACA01CR2 | 077 | RESERVED | 0B7 | RESERVED | 0F7 |
| DCA06DR0 | 038 | RESERVED | 078 | RESERVED | 0B8 | RESERVED | 0F8 |
| DCA06DR1 | 039 | ACA02CR0 | 079 | RESERVED | 0B9 | RESERVED | 0F9 |
| DCA06DR2 | 03A | ACA02CR1 | 07A | RESERVED | 0BA | RESERVED | 0FA |
| DCA06CR0 | 03B | ACA02CR2 | 07B | RESERVED | 0BB | RESERVED | 0FB |
| DCA07DR0 | 03C | RESERVED | 07C | RESERVED | 0BC | RESERVED | 0FC |
| DCA07DR1 | 03D | ACA03CR0 | 07D | RESERVED | 0BD | RESERVED | 0FD |
| DCA07DR2 | 03E | ACA03CR1 | 07E | RESERVED | 0BE | RESERVED | 0FE |
| DCA07CR0 | 03F | ACA03CR2 | 07F | RESERVED | 0BF | CPU SCR | 0FF |

| Reg Name | Addr | Reg Name | Addr | Reg Name | Addr | Reg Name | Addr |
|---|---|---|---|---|---|---|---|
| PRT0DM0 | 000 | RESERVED | 040 | ASA10CR0 | 080 | RESERVED | 0C0 |
| PRT0DM1 | 001 | RESERVED | 041 | ASA10CR1 | 081 | RESERVED | 0C1 |
| PRT0IC0 | 002 | RESERVED | 042 | ASA10CR2 | 082 | RESERVED | 0C2 |
| PRT0IC1 | 003 | RESERVED | 043 | ASA10CR3 | 083 | RESERVED | 0C3 |
| PRT1DM0 | 004 | RESERVED | 044 | ASB11CR0 | 084 | RESERVED | 0C4 |
| PRT1DM1 | 005 | RESERVED | 045 | ASB11CR1 | 085 | RESERVED | 0C5 |
| PRT1IC0 | 006 | RESERVED | 046 | ASB11CR2 | 086 | RESERVED | 0C6 |
| PRT1IC1 | 007 | RESERVED | 047 | ASB11CR3 | 087 | RESERVED | 0C7 |
| PRT2DM0 | 008 | RESERVED | 048 | ASA12CR0 | 088 | RESERVED | 0C8 |
| PRT2DM1 | 009 | RESERVED | 049 | ASA12CR1 | 089 | RESERVED | 0C9 |
| PRT2IC0 | 00A | RESERVED | 04A | ASA12CR2 | 08A | RESERVED | 0CA |
| PRT2IC1 | 00B | RESERVED | 04B | ASA12CR3 | 08B | RESERVED | 0CB |
| PRT3DM0 | 00C | RESERVED | 04C | ASB13CR0 | 08C | RESERVED | 0CC |
| PRT3DM1 | 00D | RESERVED | 04D | ASB13CR1 | 08D | RESERVED | 0CD |
| PRT3IC0 | 00E | RESERVED | 04E | ASB13CR2 | 08E | RESERVED | 0CE |
| PRT3IC1 | 00F | RESERVED | 04F | ASB13CR3 | 08F | RESERVED | 0CF |
| PRT4DM0 | 010 | RESERVED | 050 | ASB20CR0 | 090 | RESERVED | 0D0 |
| PRT4DM1 | 011 | RESERVED | 051 | ASB20CR1 | 091 | RESERVED | 0D1 |
| PRT4IC0 | 012 | RESERVED | 052 | ASB20CR2 | 092 | RESERVED | 0D2 |
| PRT4IC1 | 013 | RESERVED | 053 | ASB20CR3 | 093 | RESERVED | 0D3 |
| PRT5DM0 | 014 | RESERVED | 054 | ASA21CR0 | 094 | RESERVED | 0D4 |
| PRT5DM1 | 015 | RESERVED | 055 | ASA21CR1 | 095 | RESERVED | 0D5 |
| PRT5IC0 | 016 | RESERVED | 056 | ASA21CR2 | 096 | RESERVED | 0D6 |
| PRT5IC1 | 017 | RESERVED | 057 | ASA21CR3 | 097 | RESERVED | 0D7 |
| RESERVED | 018 | RESERVED | 058 | ASB22CR0 | 098 | RESERVED | 0D8 |
| RESERVED | 019 | RESERVED | 059 | ASB22CR1 | 099 | RESERVED | 0D9 |
| RESERVED | 01A | RESERVED | 05A | ASB22CR2 | 09A | RESERVED | 0DA |
| RESERVED | 01B | RESERVED | 05B | ASB22CR3 | 09B | RESERVED | 0DB |
| RESERVED | 01C | RESERVED | 05C | ASA23CR0 | 09C | RESERVED | 0DC |
| RESERVED | 01D | RESERVED | 05D | ASA23CR1 | 09D | RESERVED | 0DD |
| RESERVED | 01E | RESERVED | 05E | ASA23CR2 | 09E | RESERVED | 0DE |
| RESERVED | 01F | RESERVED | 05F | ASA23CR3 | 09F | RESERVED | 0DF |

| Reg Name | Addr | Reg Name | Addr | Reg Name | Addr | Reg Name | Addr |
|---|---|---|---|---|---|---|---|
| DBA00FN | 020 | CLK_CR0 | 060 | RESERVED | 0A0 | OSC_CR0 | 0E0 |
| DBA00IN | 021 | CLK_CR1 | 061 | RESERVED | 0A1 | OSC_CR1 | 0E1 |
| DBA00OU | 022 | ABF_CR | 062 | RESERVED | 0A2 | RESERVED | 0E2 |
| RESERVED | 023 | AMD_CR | 063 | RESERVED | 0A3 | VLT_CR | 0E3 |
| DBA01FN | 024 | RESERVED | 064 | RESERVED | 0A4 | RESERVED | 0E4 |
| DBA01IN | 025 | RESERVED | 065 | RESERVED | 0A5 | RESERVED | 0E5 |
| DBA01OU | 026 | RESERVED | 066 | RESERVED | 0A6 | RESERVED | 0E6 |
| RESERVED | 027 | RESERVED | 067 | RESERVED | 0A7 | RESERVED | 0E7 |
| DCA02FN | 028 | RESERVED | 068 | RESERVED | 0A8 | IMO_TR | 0E8 |
| DCA02IN | 029 | RESERVED | 069 | RESERVED | 0A9 | ILO_TR | 0E9 |
| DCA02OU | 02A | RESERVED | 06A | RESERVED | 0AA | BDG_TR | 0EA |
| RESERVED | 02B | RESERVED | 06B | RESERVED | 0AB | ECO_TR | 0EB |
| DCA03FN | 02C | RESERVED | 06C | RESERVED | 0AC | RESERVED | 0EC |
| DCA03IN | 02D | RESERVED | 06D | RESERVED | 0AD | RESERVED | 0ED |
| DCA03OU | 02E | RESERVED | 06E | RESERVED | 0AE | RESERVED | 0EE |
| RESERVED | 02F | RESERVED | 06F | RESERVED | 0AF | RESERVED | 0EF |
| DBA04FN | 030 | RESERVED | 070 | RESERVED | 0B0 | RESERVED | 0F0 |
| DBA04IN | 031 | ACA00CR0 | 071 | RESERVED | 0B1 | RESERVED | 0F1 |
| DBA04OU | 032 | ACA00CR1 | 072 | RESERVED | 0B2 | RESERVED | 0F2 |
| RESERVED | 033 | ACA00CR2 | 073 | RESERVED | 0B3 | RESERVED | 0F3 |
| DBA05FN | 034 | RESERVED | 074 | RESERVED | 0B4 | RESERVED | 0F4 |
| DBA05IN | 035 | ACA01CR0 | 075 | RESERVED | 0B5 | RESERVED | 0F5 |
| DBA05OU | 036 | ACA01CR1 | 076 | RESERVED | 0B6 | RESERVED | 0F6 |
| RESERVED | 037 | ACA01CR2 | 077 | RESERVED | 0B7 | RESERVED | 0F7 |
| DCA06FN | 038 | RESERVED | 078 | RESERVED | 0B8 | RESERVED | 0F8 |
| DCA06IN | 039 | ACA02CR0 | 079 | RESERVED | 0B9 | RESERVED | 0F9 |
| DCA06OU | 03A | ACA02CR1 | 07A | RESERVED | 0BA | RESERVED | 0FA |
| RESERVED | 03B | ACA02CR2 | 07B | RESERVED | 0BB | RESERVED | 0FB |
| DCA07FN | 03C | RESERVED | 07C | RESERVED | 0BC | RESERVED | 0FC |
| DCA07IN | 03D | ACA03CR0 | 07D | RESERVED | 0BD | RESERVED | 0FD |
| DCA07OU | 03E | ACA03CR1 | 07E | RESERVED | 0BE | RESERVED | 0FE |
| RESERVED | 03F | ACA03CR2 | 07F | RESERVED | 0BF | CPU_SCR | 0FF |

FIGURE 15B (CONT.)

151 ⟶ ▪ WORD 1   (LSB)   F0  F1  F2  G   N/C  N/C  N/C  N/C  (MSB)
152 ⟶ ▪ WORD 2   (LSB)   P0  P1  P2  N0  N1   N2   CEN  OS   (MSB)
153 ⟶ ▪ WORD 3   (LSB)   S0  S1  N/C N/C R0   R1   R2   R3   (MSB)

FIGURE 17

- WORD 0 (LSB)  A0 A1 A2 A3 A4 S PS OSZ (MSB)
- WORD 1 (LSB)  B0 B1 B2 B3 B4 I11 I12 IS3 (MSB)
- WORD 2 (LSB)  C0 C1 C2 C3 C4 AZ CS OS (MSB)
- WORD 3 (LSB)  S0 S1 IS21 IS22 DO1 DO2 R1 R2 (MSB)

FIGURE 18A

- WORD 0   (LSB)   A0 A1 A2 A3 A4 S PS OSZ (MSB)
- WORD 1   (LSB)   B0 B1 B2 B3 B4 I11 I12 IS3 (MSB)
- WORD 2   (LSB)   C0 C1 C2 C3 C4 AZ CS OS (MSB)
- WORD 3   (LSB)   S0 S1 MB N/C DO1 DO2 R1 R2 (MSB)

FIGURE 18B

PROGRAMMING METHODOLOGY AND ARCHITECTURE FOR A PROGRAMMABLE ANALOG SYSTEM

RELATED U.S. APPLICATION

This application claims priority to the provisional patent application Ser. No. 60/243,708, entitled "Advanced Programmable Microcontroller Device," with filing date Oct. 26, 2000, now abandoned, and assigned to the assignee of the present application.

TECHNICAL FIELD

The present invention generally relates to the field of microcontrollers. More specifically, the present invention pertains to a methodology for dynamically configuring and programming a mixed signal system-on-a-chip architecture to perform a variety of analog functions.

BACKGROUND ART

Microcontrollers function to replace mechanical and electromechanical components in a variety of applications and devices. Microcontrollers have evolved since they were first introduced approximately 30 years ago, to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely effect the choice of microcontroller. The designer thus again faces the challenge of finding a suitable micrbcontroller for the intended application.

One solution to the problems described above is to design (or have designed) a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times. Moreover, the option of designing a custom microcontroller is generally only available to very large volume customers.

Application specific integrated circuits (ASICS) may suggest a solution to the problem of finding a suitable microcontroller for an application. However, ASICs can also be problematic because they require a sophisticated level of design expertise, and the obstacles of long development times, high costs, and large volume requirements still remain. Solutions such as gate arrays and programmable logic devices provide flexibility, but they too are expensive and require a sophisticated level of design expertise.

Accordingly, what is needed is a system and/or method that can allow microcontrollers to be developed for a variety of possible applications without incurring the development expenses and delays associated with contemporary microcontrollers. The present invention provides a novel solution to these needs.

DISCLOSURE OF THE INVENTION

The present invention provides a programmable analog system methodology and architecture that is suited for a variety of applications and that can reduce development time and expenses. The programmable analog system architecture is integrated with a microcontroller that provides sequencing and programming instructions. Embodiments of the present invention introduce a method of configuring and programming a set of tailored analog blocks and elements that can be configured and reconfigured in different ways to implement a variety of different analog functions. The analog blocks can be electrically coupled to each other in different combinations to perform different analog functions. Each analog block includes analog elements that have changeable characteristics that can be specified according to the function to be performed. Configuration registers define the type of function to be performed, the way in which the analog blocks are to be coupled, the inputs and outputs of the analog blocks, and the characteristics of the analog elements. The configuration registers can be dynamically programmed.

In the present embodiment, the analog blocks are arranged in an array on a single integrated circuit, or chip. The analog system architecture can be generally referred to as a programmable analog "system-on-a-chip" block. Such blocks can be used in those applications that typically require multiple chips that may be fabricated using different technologies. Implementation in embedded applications, including audio, wireless, handheld, data communications, Internet control, and industrial and consumer systems, is contemplated.

In one embodiment, the analog blocks include switched analog blocks that can be electrically coupled to and decoupled from one or more other analog blocks according to configuration information in configuration registers. That is, latches and switches can be dynamically configured so that signals can be passed from one block to another, while other blocks are bypassed. Accordingly, a set of analog blocks can be selectively combined to implement a particular analog function. Other analog functions can be implemented by selectively combining a different set of analog blocks.

In one embodiment, the switched analog blocks are switched capacitor blocks. In another embodiment, two different types of switched capacitor blocks are used; the two types are distinguishable according to the type and number of inputs they receive and how those inputs are treated. In yet another embodiment, the analog blocks also include continuous time blocks.

In one embodiment, a number of configuration registers are coupled to the analog blocks. Configuration information is received into the configuration registers at boot time (bootup) of the microcontroller, or at a subsequent time during program execution. The information in the configuration registers is used for selectively coupling analog blocks, for specifying characteristics of the analog elements in each of the analog blocks, and for specifying the inputs and outputs for the analog blocks. The information in the registers can be dynamically changed to couple different combinations of analog blocks, to specify different characteristics of the analog elements, or to specify different inputs and outputs for the analog blocks, thereby realizing different analog functions using the same array of analog blocks.

In various embodiments, in addition to selectively coupling analog blocks and for specifying the inputs and outputs of each of the analog blocks, bit(s) are set in the configuration register (or registers) of an analog block to: include a compensating capacitor for a comparator function or to bypass the compensating capacitor; specify a power level; specify a resistance value of a resistor; specify a capacitance of a capacitor; change the phase of an input; select a clock phase for sampling an input; and/or control a switch.

Thus, the device can be used to realize a large number of different analog functions and applications. These and other objects and advantages of the present invention will become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 15A and 15B are exemplary register banks used for configuring on-chip resources in accordance with one embodiment of the present invention.

FIG. 17 describes one embodiment of the contents of the registers used for configuring a continuous time block in accordance with the present invention.

FIG. 18A describes one embodiment of the contents of the registers used for configuring the switched capacitor block of FIG. 9 in accordance with the present invention.

FIG. 18B describes one embodiment of the contents of the registers used for configuring the switched capacitor block of FIG. 10 in accordance with the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "receiving," "coupling," "changing," "storing," "setting," "specifying," "causing," "selecting" or the like, refer to the actions and processes of a computer system or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

A Programmable Analog System Architecture

Figure 1:
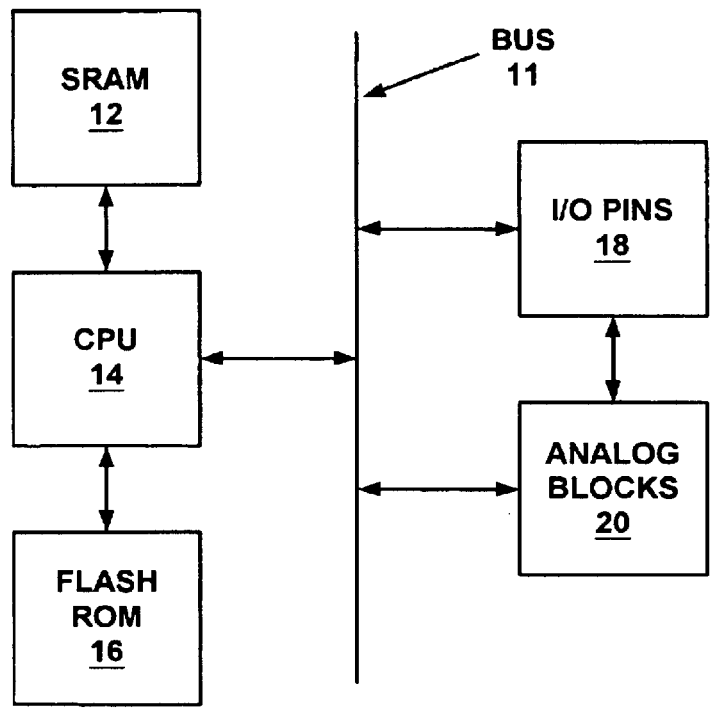
FIG. 1 is a block diagram showing an exemplary integrated circuit (or microcontroller) upon which embodiments of the present invention may be implemented.

FIG. 1 is a block diagram showing an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and analog blocks 20. The analog blocks 20 are further described below. A test interface (not shown) may be coupled to integrated circuit 10 to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely.

Analog blocks 20 are configurable system resources that can reduce the need for other microcontroller parts and external components. In the present embodiment, analog blocks 20 include an array of twelve blocks. A precision internal voltage reference provides accurate analog comparisons. A temperature sensor input is provided to the array of analog blocks to support applications like battery chargers and data acquisition without requiring external components.

In the present embodiment, two register banks are implemented on microcontroller 10, although it is appreciated that a different number of register banks (including a single bank) may alternatively be used. In one embodiment, each of the register banks contains 256 bytes. A portion of these bytes are allocated for addressing configuration registers used to configure the analog blocks 20. Additional information is provided in conjunction with FIGS. 15A, 15B and 16, below.

In one embodiment, each of the analog blocks 20 is assigned up to four registers for programming block functions, characteristics (e.g., coefficient values) of analog elements in the analog blocks 20, and routing of inputs and outputs for the analog blocks 20. These registers may be physically located either on the analog blocks or external to the analog blocks. Additional information is provided in conjunction with FIGS. 17, 18A and 18B, below.

In the present embodiment, there are three types of analog blocks: continuous time blocks, and two types of switched capacitor blocks (referred to herein as type A and type B).

Continuous time blocks provide continuous time analog functions. Continuous time blocks are described in further detail in conjunction with FIG. 4A.

Switched capacitor blocks provide discrete time analog functions such as analog-to-digital conversion (ADC) and digital-to-analog conversion (DAC) functions. The key difference between the type A and type B switched capacitor blocks is in generating biquad filters (see FIGS. 14A and 14B below). Both type A and type B blocks can implement basic switched capacitor functions (outside of filters), and the type A block can also function as a summing amplifier. Switched capacitor blocks are described in further detail in conjunction with FIGS. 9A and 12A below.

Analog functions supported by integrated circuit 10 comprising analog blocks 20 include, but are not limited to: 14-bit multi-slope and 12-bit delta-sigma ADC, successive approximation ADCs up to nine bits, DACs up to nine bits, programmable gain stages, sample and hold circuits, filters (high band pass and low band pass) with programmable coefficients, amplifiers, differential comparators, and temperature sensors.

Figure 2:
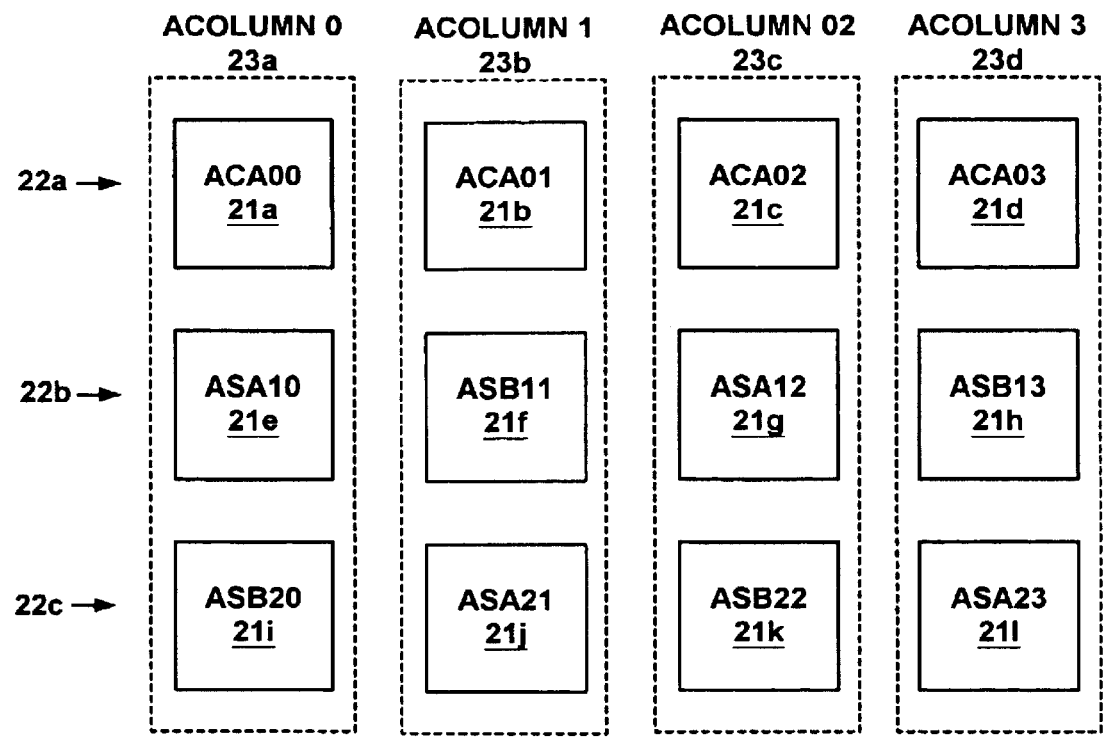
FIG. 2 shows an array of analog blocks in accordance with one embodiment of the present invention.

FIG. 2 shows an array of analog blocks 20 in accordance with one embodiment of the present invention. In this embodiment, there are twelve analog blocks 21a–21l arranged in an array of three rows 22a–22c by four columns 23a–23d. Each column 23a–d includes one of each type of analog block, e.g., a continuous time block 21a–d (designated "ACAxx"); a type A switched capacitor block 21e, 21g, 21j and 21l (designated "ASAxx"); and a type B switched capacitor block 21f, 21h, 21i, and 21k (designated "ASBxx"). Note that, in this embodiment, the type A and type B switched capacitor blocks in rows 22b and 22c are arranged in an alternating, or checkerboard, pattern.

In the present embodiment, the analog blocks 21a–l can be powered down individually to different power levels, so that it is not necessary for all of the blocks to be running at full power. In one embodiment, the analog blocks 21a–l have four power levels.

Figure 3:
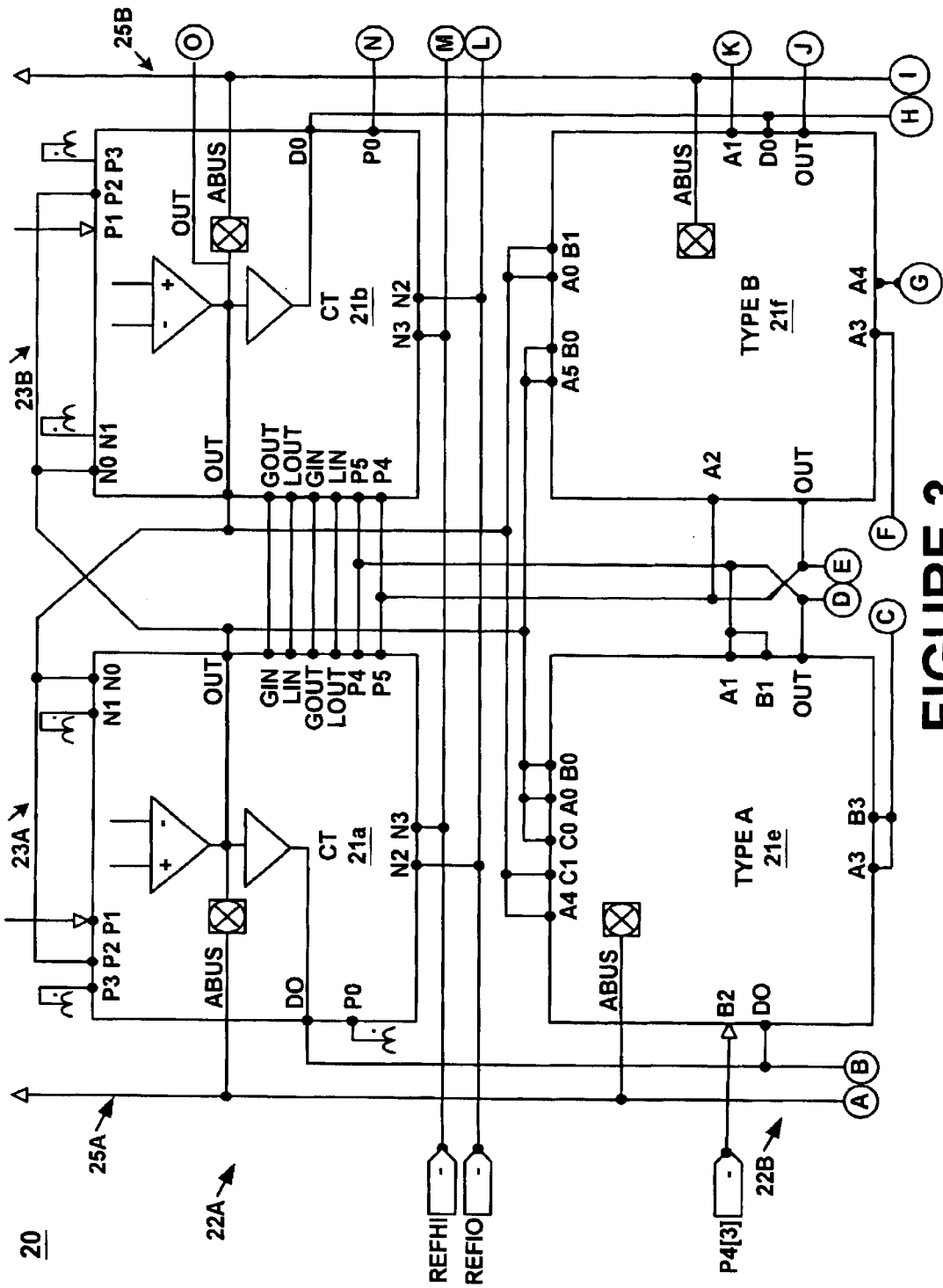
FIG. 3 shows the interconnects between analog blocks in an array in accordance with one embodiment of the present invention.
Figure 3:
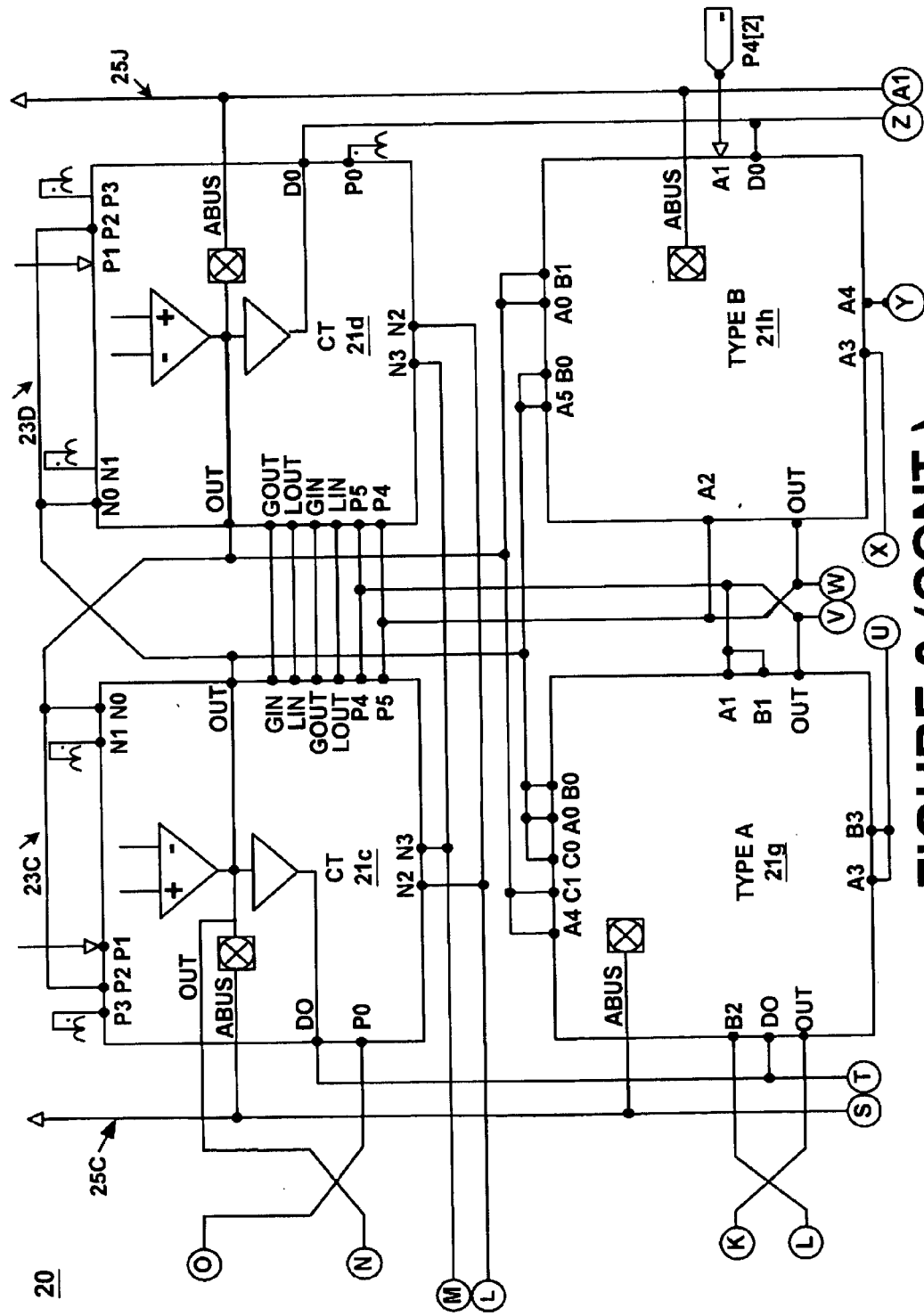
Figure 3:
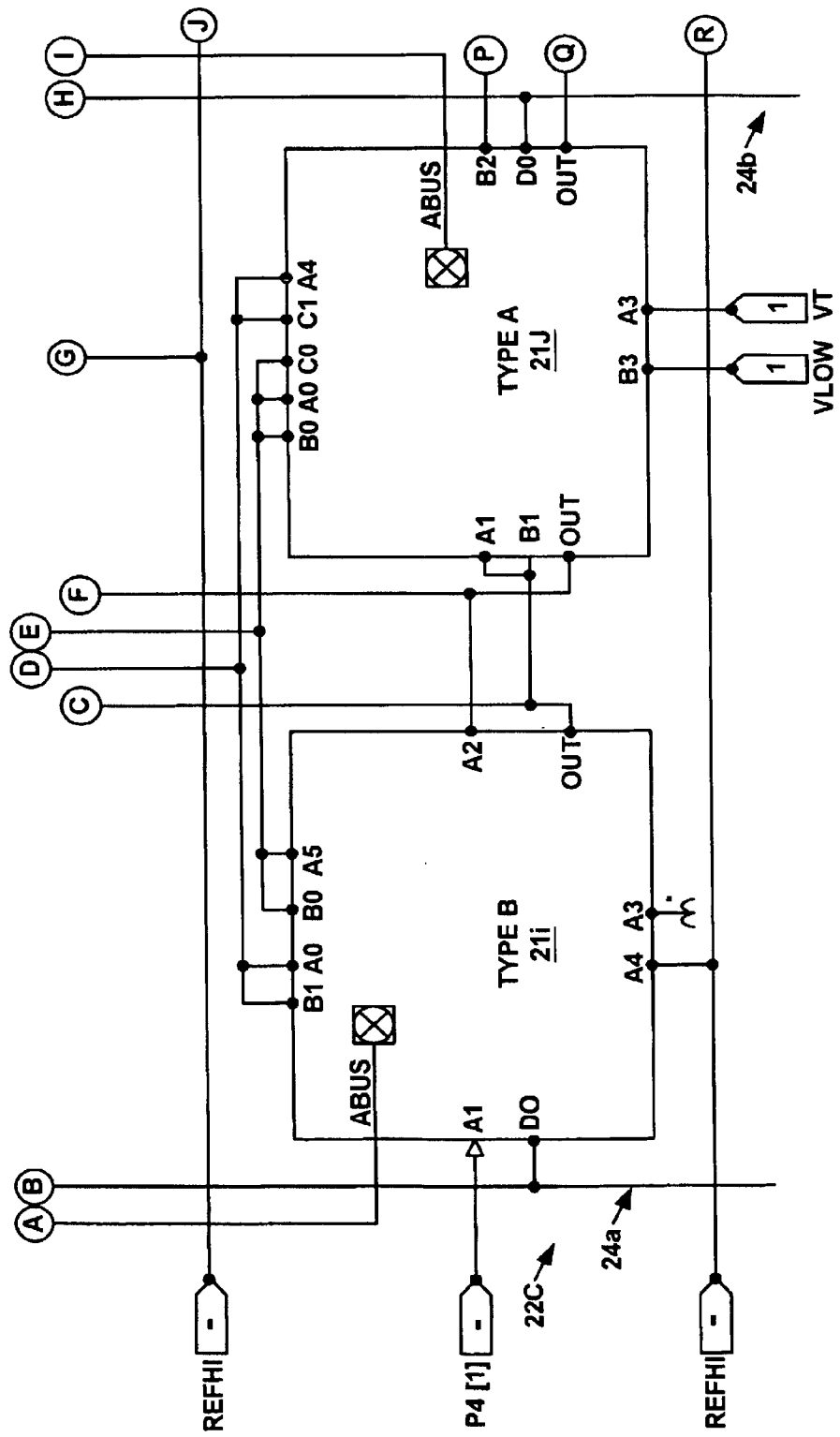
Figure 3:
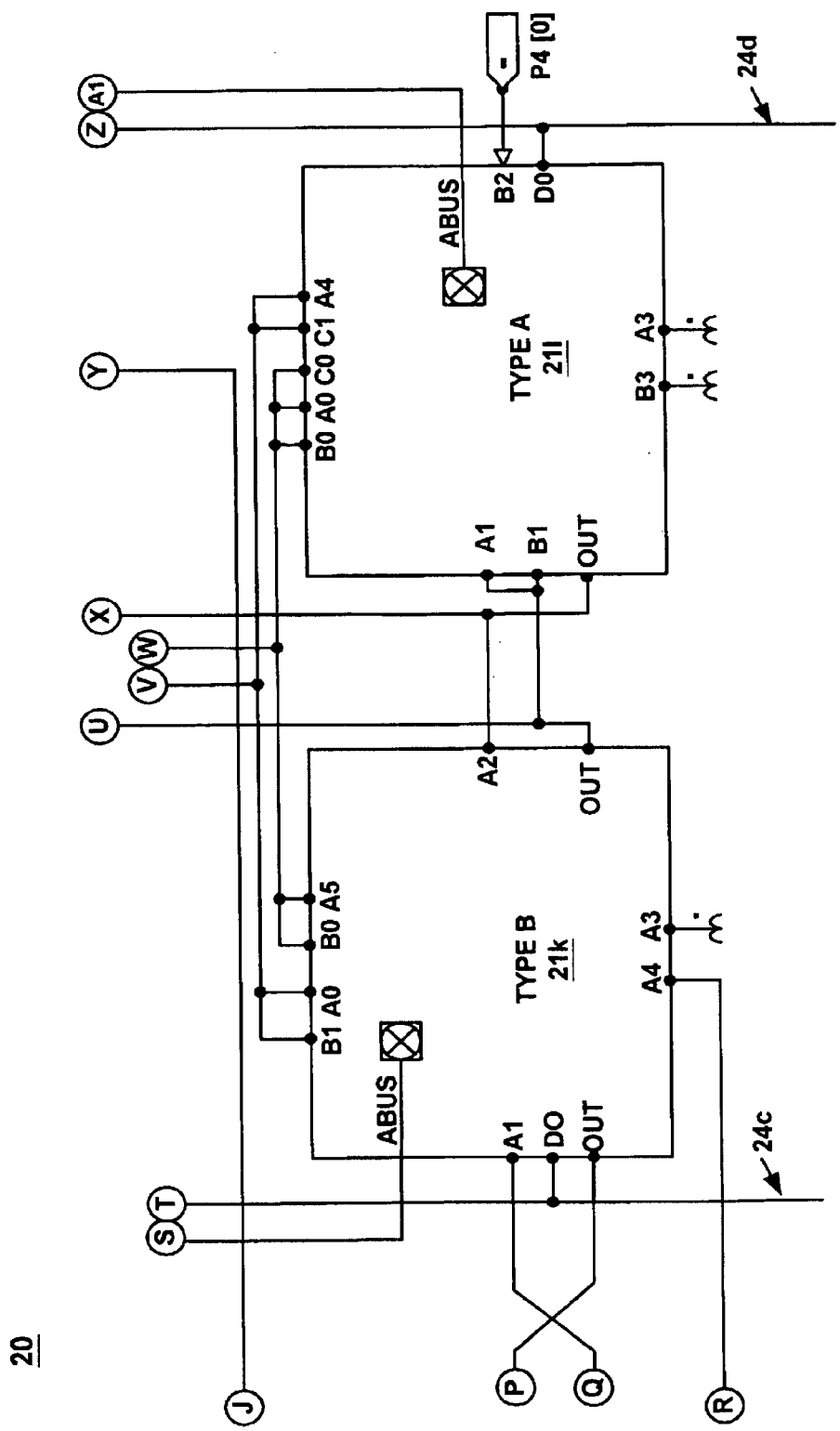

FIG. 3 shows the interconnects between analog blocks 20 in an array in accordance with one embodiment of the present invention. In this embodiment, each analog block 21a–l is interconnected with its adjacent (e.g., nearest neighbor) analog block. Note that, although the analog blocks 21a–l are interconnected, they may not be electrically coupled. The distinction between being connected and being electrically coupled is important because the analog functions performed by the analog blocks 20 are implemented by enabling certain analog blocks of the circuit and bypassing others according to user programming. That is, certain analog blocks in the array of analog blocks 20 are selectively and electrically coupled to other analog blocks according to the function to be performed. As will be seen, the analog functions are also implemented by setting characteristics of passive elements (e.g., capacitors and resistors) within each of the analog blocks 20.

In accordance with the present invention, different combinations of analog blocks 20 can be selected according to the user programming in order to perform different functions. In one embodiment, individual analog blocks can be enabled and bypassed, respectively, by enabling and closing appropriate switches in response to the programming. Signals are thereby routed through the analog blocks 20 by enabling and closing programmable switches, so that the signals are routed to the analog blocks necessary to accomplish the particular analog function selected. Mechanisms other than switches may be used to enable and bypass analog blocks.

In the present embodiment, for each column 23a–d, there is a respective digital bus 24a–d and a respective analog bus 25a–d coupled to each analog block in the column. Any analog block on these buses can have its output enabled to drive the buses. The analog buses 25a–d are each a gated operational amplifier output. The digital buses 24a–d are each a comparator output derived by buffering the operational amplifier (op-amp) output through an inverter. In one embodiment, reference buses (not shown) are also provided to provide a reference voltage for ADC and DAC functions.

In the present embodiment, data essentially flow through the array of analog blocks 20 from top to bottom (e.g., from row 22a to row 22c). The continuous time blocks 21a–d can be programmed to serve as a first-order isolation buffer, if necessary.

In FIG. 3, output signals from each analog block include D0 and those signals that include "out" in their designation (such as OUT, GOUT, and LOUT). Signals labeled otherwise are input signals to a block.

Figure 4A:
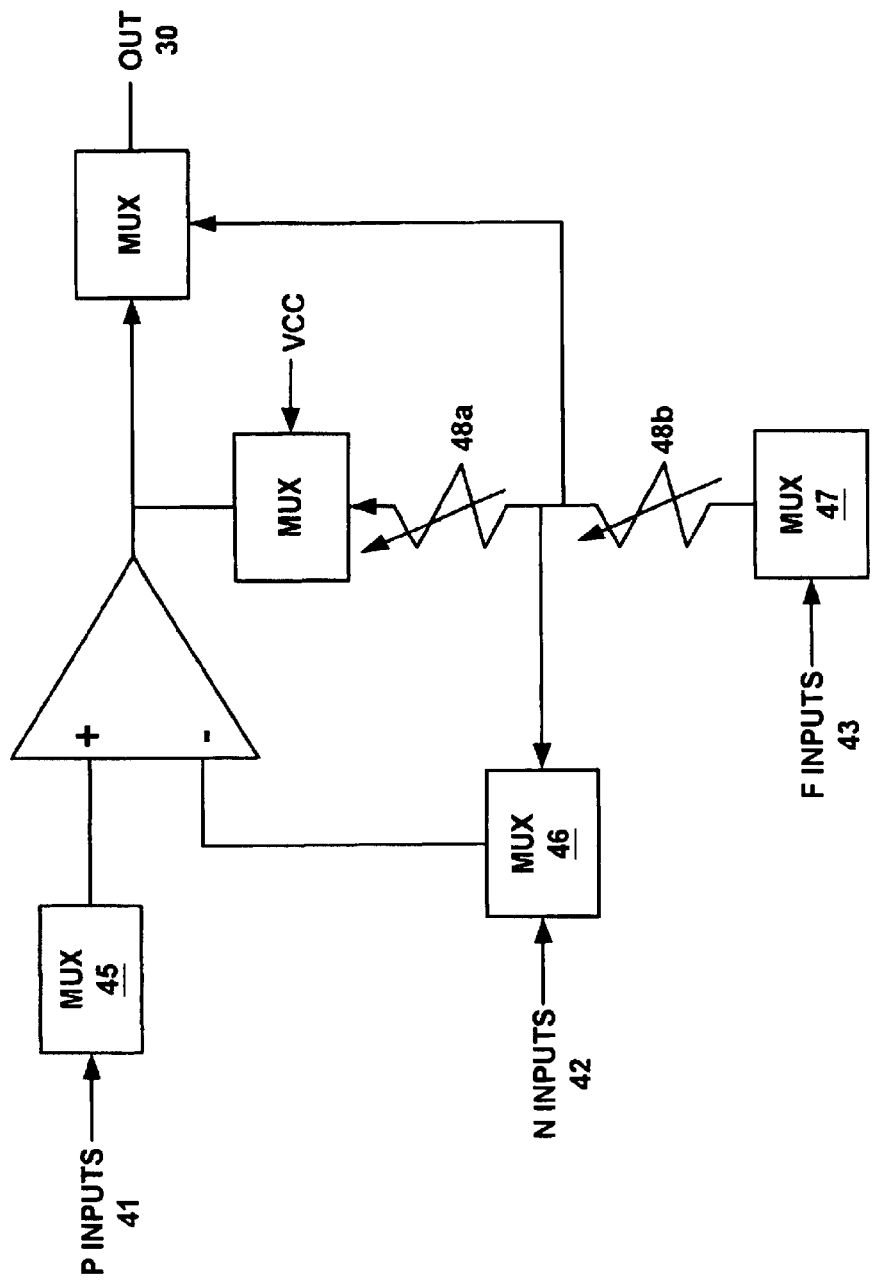
FIG. 4A is a functional block diagram of one embodiment of a continuous time block in accordance with the present invention.

FIG. 4A is a functional block diagram of one embodiment of a continuous time block 40 in accordance with the present invention. Continuous time block 40 exemplifies continuous time blocks 21a–d of FIGS. 2 and 3. Continuous time block 40 is unclocked; that is, an analog signal input to continuous time block 40 may vary with time, and the output of continuous time block 40 will reflect that (instead of sampling the input as a clocked block would).

In the present embodiment, continuous time block 40 of FIG. 4A performs basic amplifier operations. In one embodiment, one function of continuous time block 40 is to amplify and isolate analog inputs to the array of analog blocks 20 (FIG. 3), although continuous time block 40 may not always be used in this manner. Continuous time block 40 also provides the means to convert differential input voltages into single-ended signals to drive other analog blocks 20.

In the present embodiment, continuous time block 40 of FIG. 4A receives positive (P) inputs 41 at multiplexer (MUX) 45, negative (N) inputs 42 at MUX 46, and feedback (F) inputs at MUX 47. Multiplexers 45, 46 and 47 function as controlled switches for directing the inputs through continuous time block 40. It is appreciated that the inputs to continuous time block 40 are a function of the location of continuous time block 40 in the array of analog blocks 20 (FIGS. 2 and 3), and that the inputs received by continuous time block 40 depend on the particular analog function being implemented.

Continuous time block 40 also includes analog elements having characteristics that can be set and changed in response to the user's programming in accordance with the particular analog function to be implemented. In the present embodiment, continuous time block 40 includes programmable resistors 48a and 48b. In accordance with the present invention, the resistance of resistors 48a and 48b can be changed in response to the user's programming.

Figure 4B:
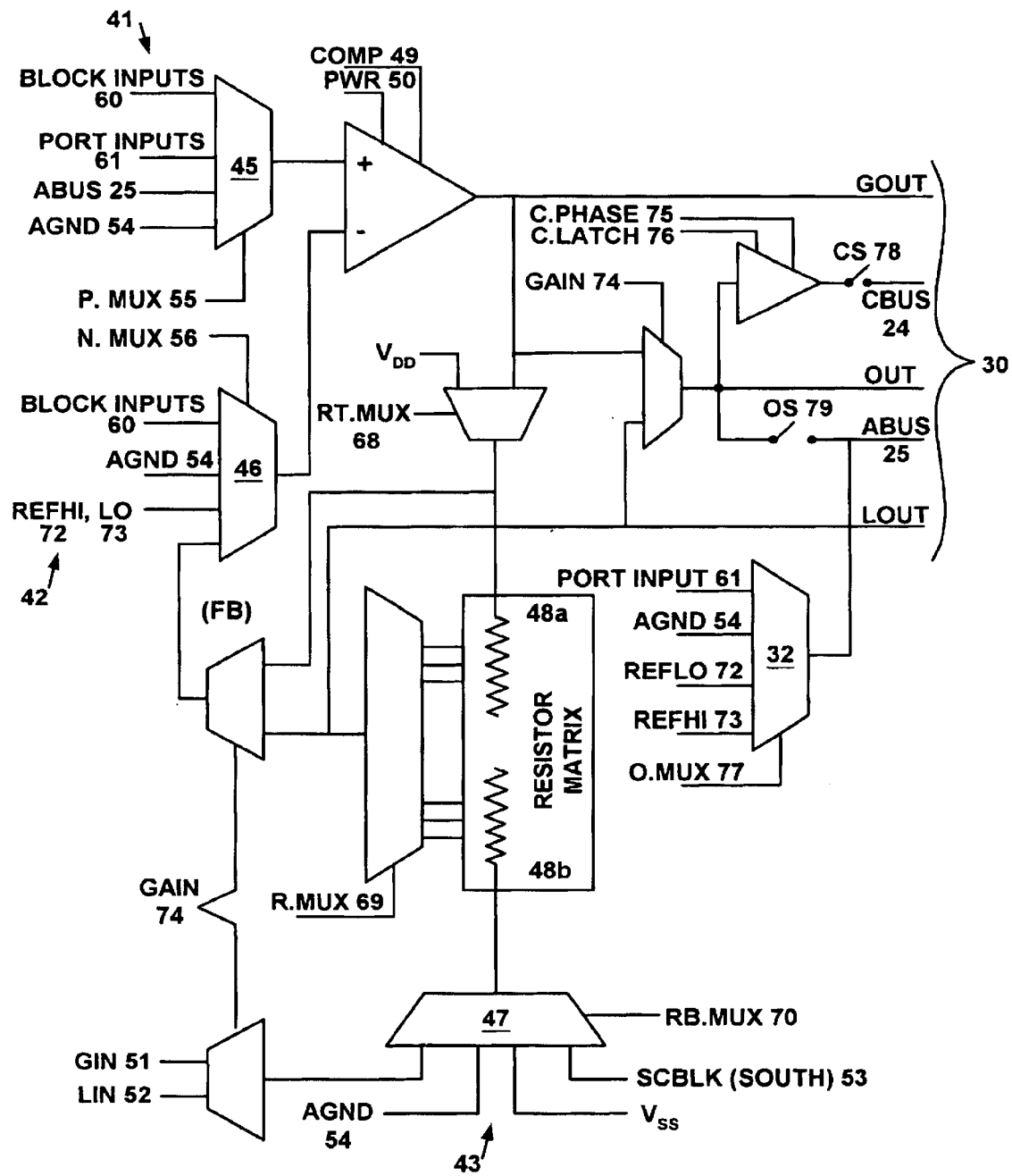
FIG. 4B is a schematic diagram of one embodiment of a continuous time block in accordance with the present invention.

FIG. 4B is a schematic diagram of one embodiment of a continuous time block 40 in accordance with the present invention. Block inputs 60 are inputs received from other analog blocks in the array of analog blocks 20 (FIG. 2). SCBLK (SOUTH) 53 is the input from a switched capacitor block below continuous time block 40 in a column 23a–d (FIG. 3). Port inputs 61 are inputs received from components and elements external to the array of analog blocks 20. ABUS 25 is the input from the analog bus (e.g., analog buses 25a–d of FIG. 3) and AGND 54 is the analog ground. CBUS 24 is the output to the digital bus (e.g., buses 24a–d of FIG. 3). Other outputs (OUT) 30 include GOUT, OUT and LOUT (see FIG. 3). When cascading two blocks, GOUT is used when trying to achieve a gain, and LOUT is used when trying to achieve a loss. REFLO 72 and REFHI 73 are reference voltages.

Continuing with reference to FIG. 4B, GAIN 74 controls whether the resistor string (48a, 48b) is connected around the op-amp for gain or loss (note that GAIN 74 does not guarantee a gain or loss block; this is determined by the routing of the other ends of the resistors 48a–b). GIN 51 and LIN 52 are inputs to continuous time block 40 (see also FIG. 3). P.MUX 55, N.MUX 56 and RB.MUX 70 are bit streams which control the non-inverting input MUX 45, the inverting input MUX 46, and MUX 47, respectively. R.MUX 69 is a bit stream controlling the center tap of the resistor string 48a–b. RT.MUX 68 is a bit stream controlling the connection of the two ends of the resistor string 48a–b. RT.MUX bits 68 control the top end of the resistor string 48a–b, which can either be connected to Vcc or to the op-amp output. RB.MUX bits 70 control the connection of the bottom end of the resistor string 48a–b.

With reference still to FIG. 4B, MUX 32 under control of bit stream O.MUX 77 provides a testability feature by feeding signals into continuous time block 40 that bypass the other portions of the block. COMP 49 is a bit controlling whether the compensation capacitor (not shown) is switched in or not in the op-amp. By not switching in the compensation capacitance, a fast response can be obtained if the amplifier is being used as a comparator.

PWR 50 is a bit stream for encoding the power level for continuous time block 40. C.PHASE 75 controls which internal clock phase the comparator data are latched on. C.LATCH 76 controls whether the latch is active or if it is always transparent. CS 78 controls a tri-state buffer that drives the comparator logic. OS 79 controls the analog output bus (ABUS 25). A complementary metal oxide semiconductor (CMOS) switch connects the op-amp output to ABUS 25.

Figure 5:
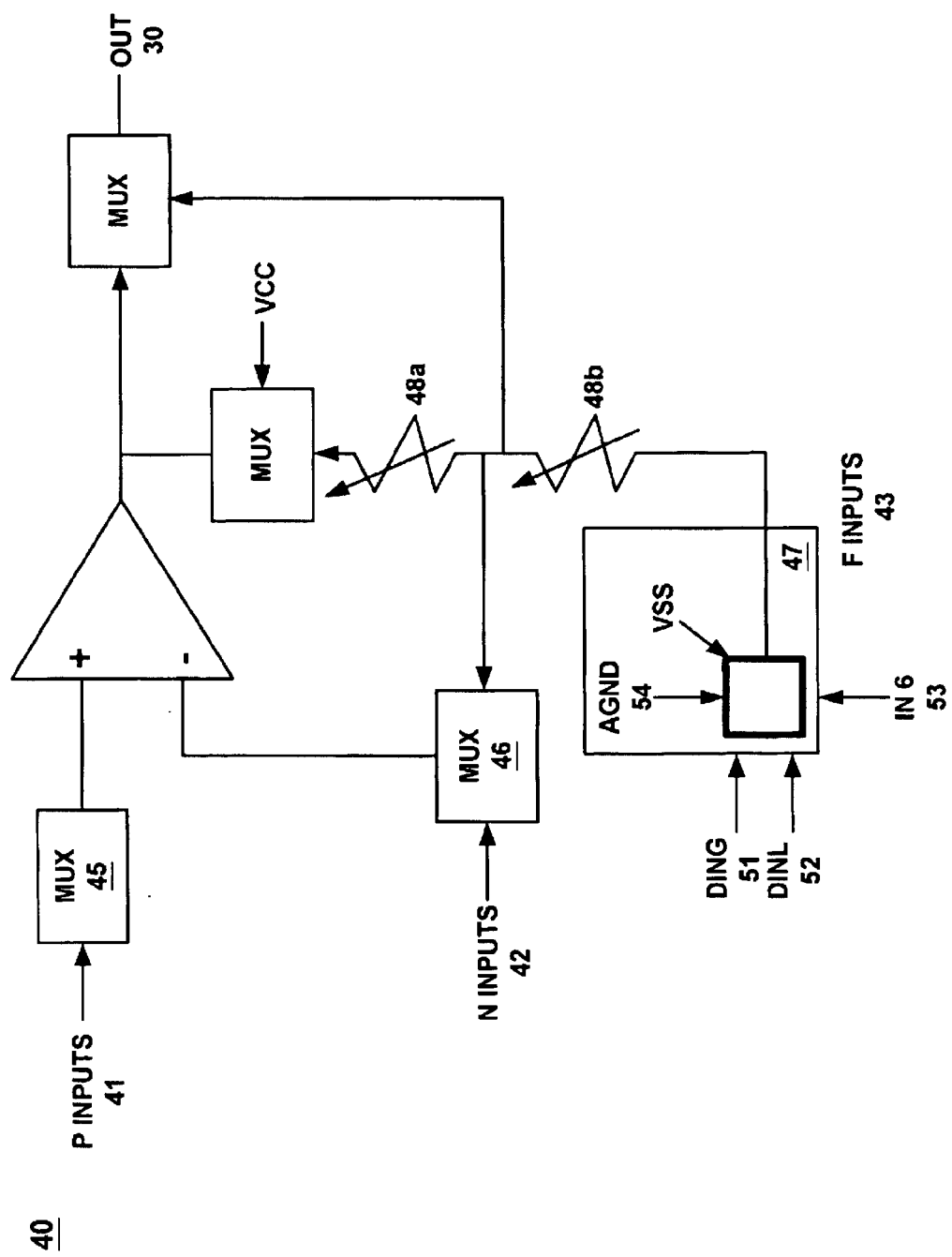
FIG. 5 illustrates the feedback inputs into a continuous time block in accordance with one embodiment of the present invention.

FIG. 5 illustrates the feedback inputs 43 into a continuous time block 40 in accordance with one embodiment of the present invention. DING 51 is GIN 51 of FIG. 4B, DINL 52 is LIN 52 of FIG. 4B, and AGND 54 is the analog (actual) ground. IN6 (SCBL:) 53 is the input from a switched capacitor block situated below continuous time block 40 in a column 23a–d in an array of analog blocks 20 (FIG. 3).

Figure 6:
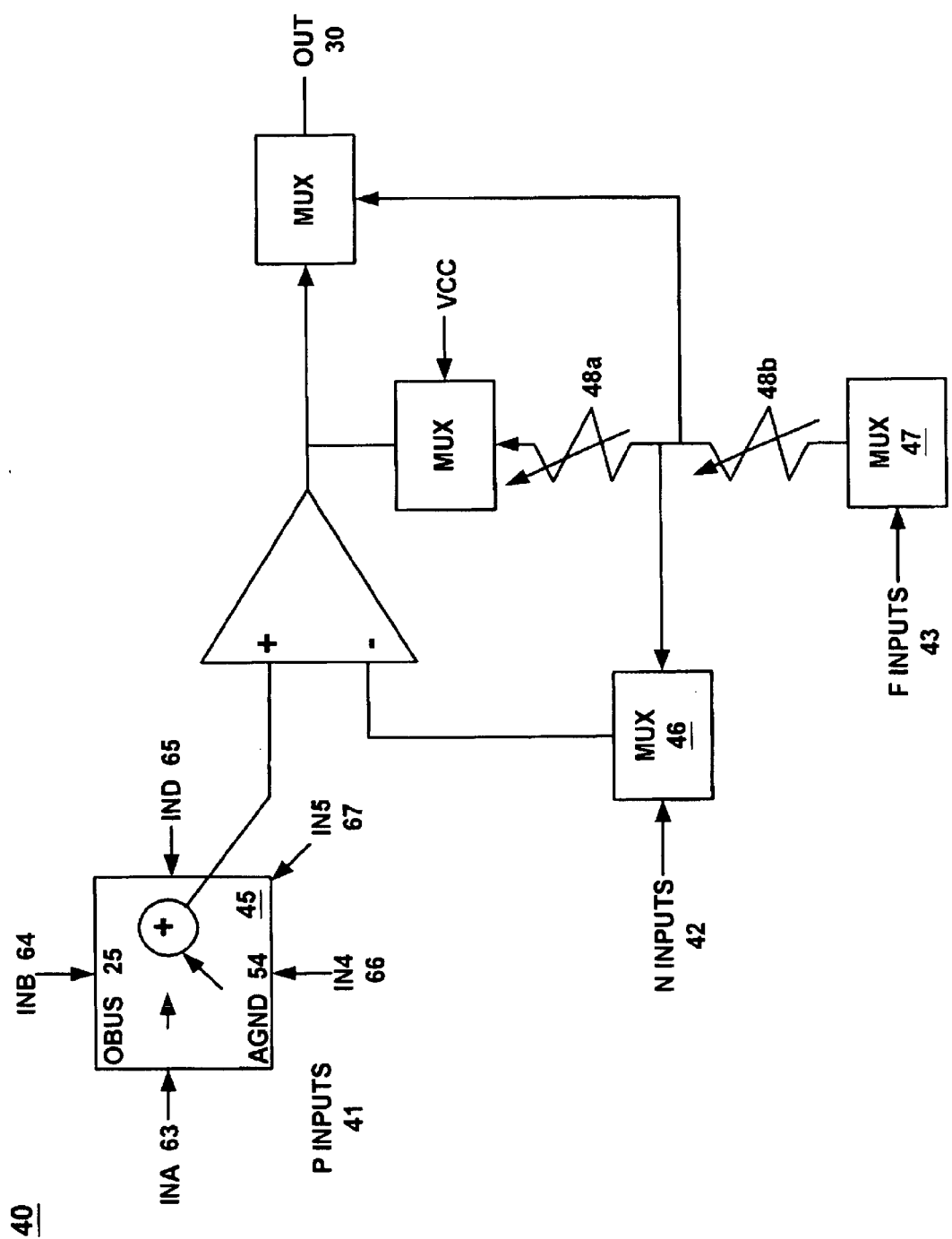
FIG. 6 illustrates the positive inputs into a continuous time block in accordance with one embodiment of the present invention.

FIG. 6 illustrates the positive inputs 41 into a continuous time block 40 in accordance with one embodiment of the present invention. AGND 54 is the analog ground, and OBUS (ABUS) 25 is the input from the analog bus (e.g., analog buses 25a–d of FIG. 3). INA 63 and IND 65 are the inputs from another continuous time block; that is, the continuous time blocks to either side of continuous time block 40. If continuous time block 40 is situated on the left or right edge of the array of analog blocks 20 (FIG. 3), such as in columns 23a or 23d, then only one of the inputs INA 63 or IND 65 would be present. INB 64 is the input from outside of the array of analog blocks 20. IN4 66 and IN5 67 are input from adjacent switched capacitor blocks, either in the same column as continuous time block 40 or from a switched capacitor block in an adjacent column.

Figure 7:
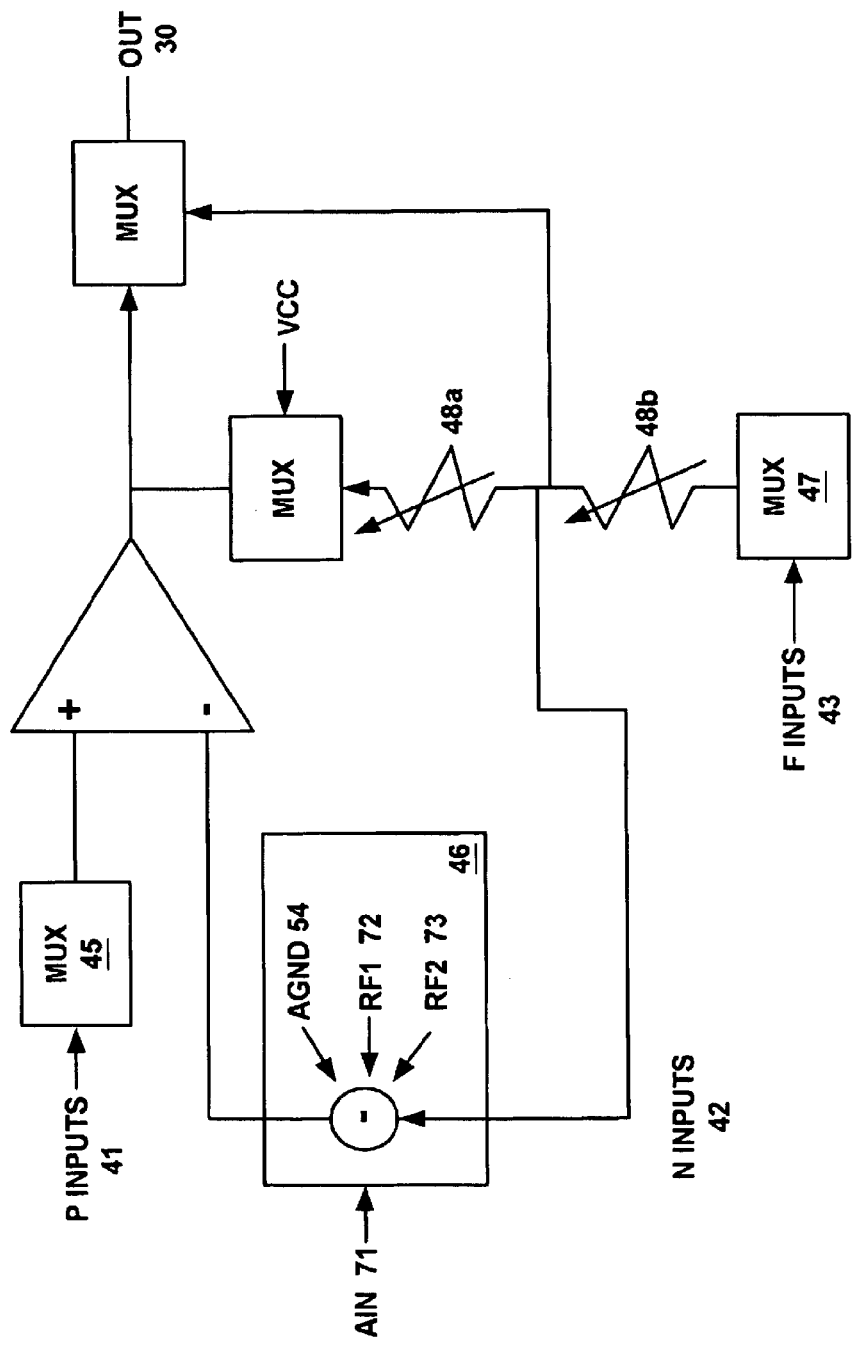
FIG. 7 illustrates the negative inputs into a continuous time block in accordance with one embodiment of the present invention.

FIG. 7 illustrates the negative inputs 42 into a continuous time block 40 in accordance with one embodiment of the present invention. AGND 54 is the analog ground, and AIN 71 is the input from an adjacent continuous time block (depending on the location of continuous time block 40 in the array of analog blocks 20 of FIG. 3, there may be more than one input from an adjacent continuous time block, as described in the preceding paragraph). RF1 (REFLO) 72 and RF2 (REFHI) 73 are reference voltages.

Figure 8A:
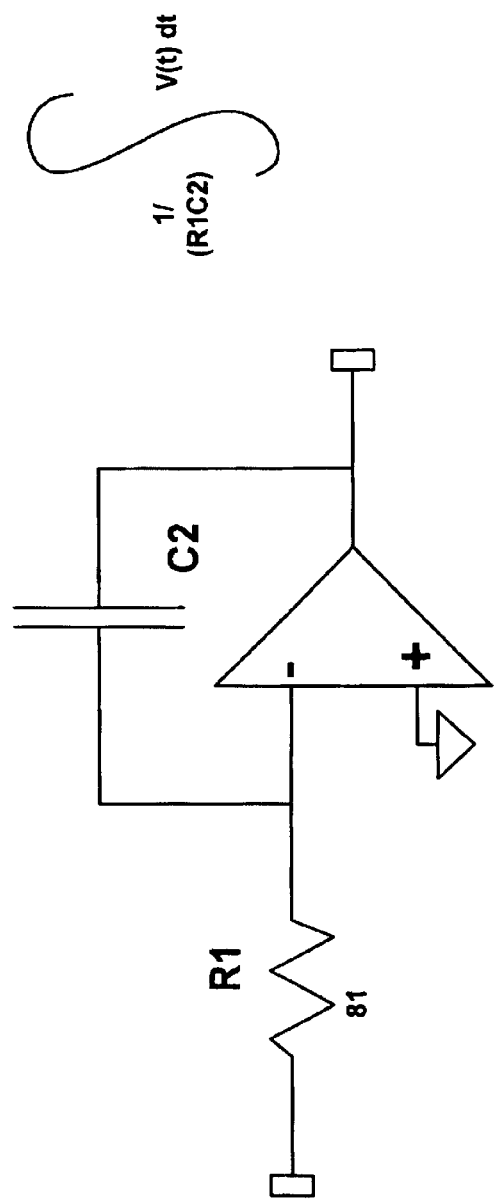
FIGS. 8A and 8B are circuit diagrams illustrating the functionality of a switched capacitor circuit by comparison to another circuit in accordance with one embodiment of the present invention.
Figure 8B:
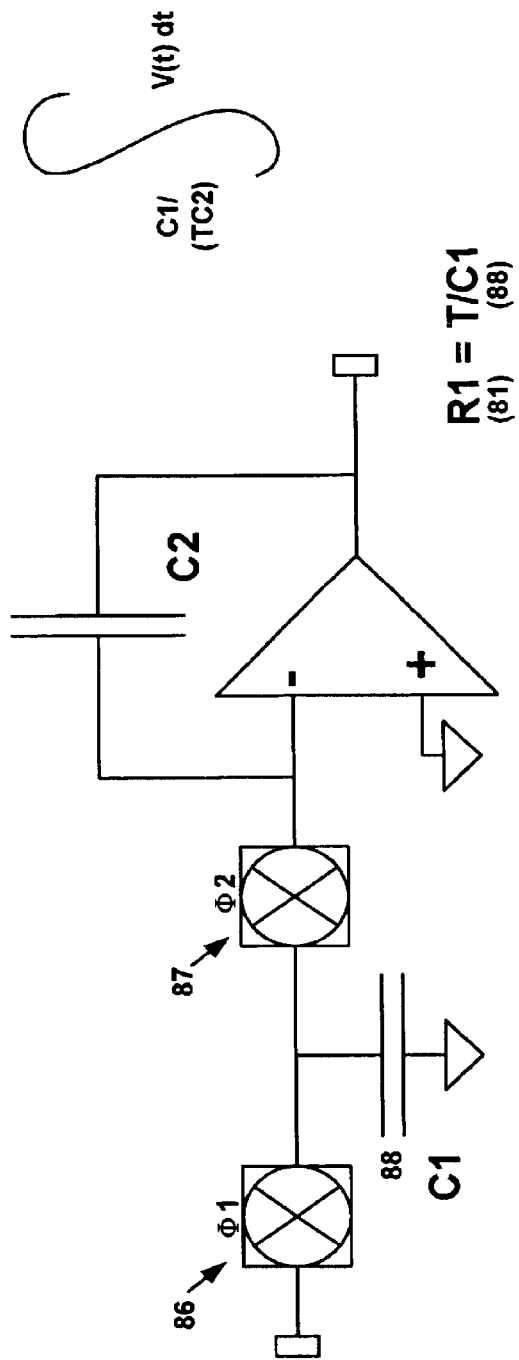

FIGS. 8A and 8B are circuit diagrams illustrating the functionality of a switched capacitor circuit 85 by comparison to another circuit 80 in accordance with one embodiment of the present invention. In FIG. 8A, an amount of current flows through resistor 81 in a time period T. Resistor 81 has a resistance value of R1. In FIG. 8B, switch 86 and switch 87 of switched capacitor circuit 85 are enabled and closed according to clock phases φ1 and φ2, respectively. Switched capacitor circuit 85 also includes a capacitor 88 with a capacitance of C1. An amount of charge will transfer through switches 86 and 87 in a time period T. In essence, the amount of charge transferred through switches 86 and 87 in time period T will appear like a current (current being charge per time). The resistance of switched capacitor circuit 85 equivalent to R1 is T/C1.

Figure 9A:
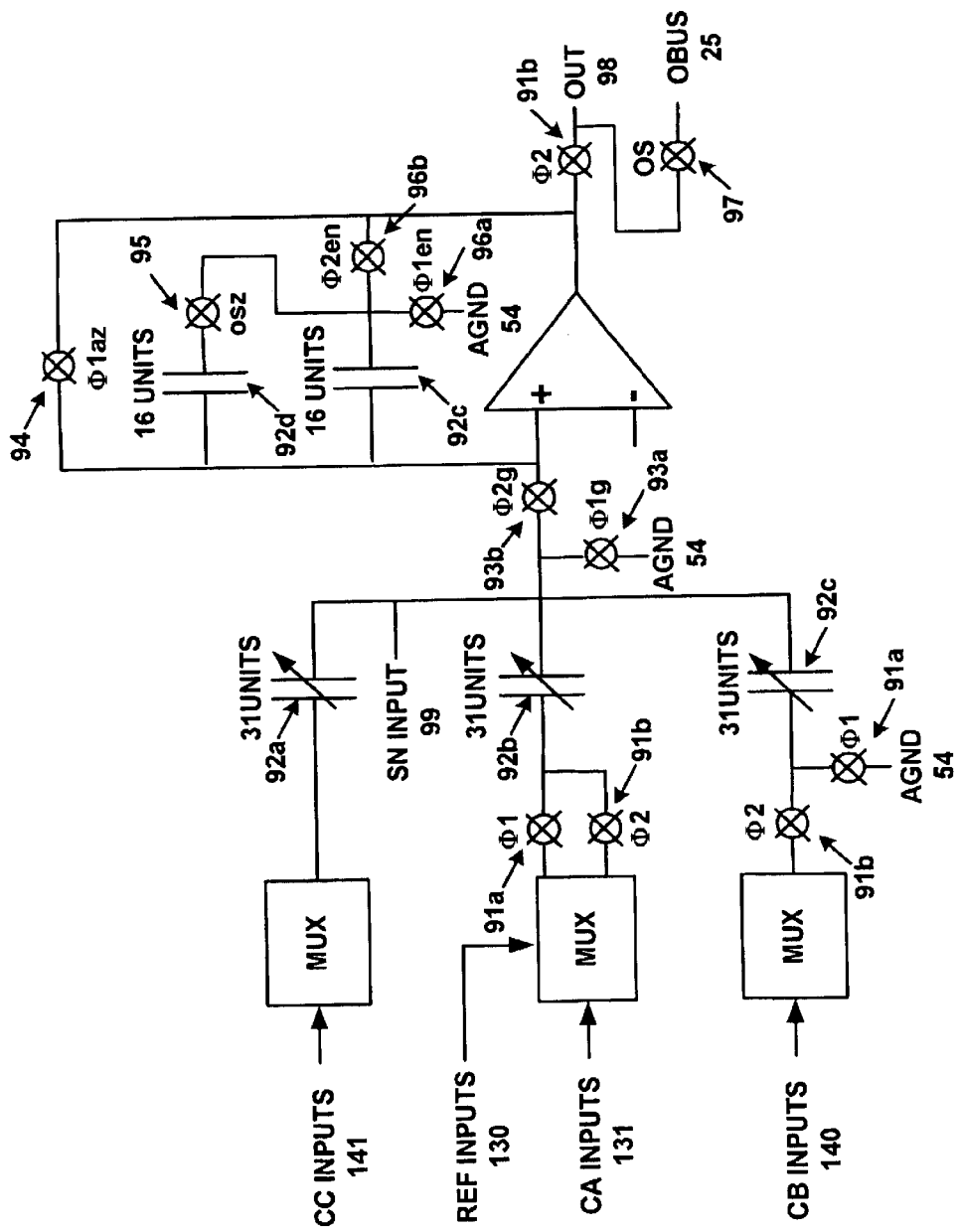
FIG. 9A is a block diagram of one embodiment of a switched capacitor block in accordance with the present invention.

FIG. 9A is a block diagram of one embodiment of a switched capacitor block 90 in accordance with the present invention. This embodiment of switched capacitor block 90 is referred to as a type A switched capacitor block. Switched capacitor block 90 exemplifies analog blocks 21e, 21g, 21j and 21l of FIGS. 2 and 3.

With reference to FIG. 9A, the present embodiment of switched capacitor block 90 receives reference (REF) inputs 130, SN input 99, and inputs from three different types of capacitor arrays. CA inputs 131, CB inputs 140 and CC inputs 141. The designations "CA," "CB" and "CC" are simply chosen to distinguish the three different types of capacitor arrays. REF inputs 130 and CA inputs 131 are described further in conjunction with FIG. 10, and CB inputs 140 and CC inputs 141 are described further in conjunction with FIG. 11. SN input 99 is a summary node of the array of analog blocks 20 (FIG. 3). It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Continuing with reference to FIG. 9A, AGND 54 is the analog ground, OBUS (ABUS) 25 is the output to the analog bus (e.g., analog buses 25a–d of FIG. 3), and OUT 98 is an output from switched capacitor block 90 that may serve as an input to an adjacent switched capacitor block (refer to FIG. 3).

In the present embodiment, switched capacitor block 90 includes a multiplicity of switches 91a, 91b, 93a, 93b, 94, 95, 96a, 96b and 97. Each of the switches 91a–b, 93a–b, 94, and 96a–b is assigned to a clock phase φ1 or φ2; that is, they are enabled or closed depending on the clock phase. Switches 93a–b, 94, and 96a–b are assigned to gated clocks and function in a known manner. Switches 95 and 97 are not clocked but instead are enabled or closed depending on the user's programming.

Switched capacitor block 90 also includes analog elements having characteristics that can be set and changed in response to the user's programming in accordance with the particular analog function to be implemented. In the present embodiment, switched capacitor block 90 includes capacitors 92a–92e. In accordance with the present invention, the capacitance of capacitors 92a–e can be changed in response to the user's programming. In the present embodiment, the capacitors 92a–c are binarily weighted capacitors that allow the capacitor weights to be programmed by the user, while the capacitors 92d–e are either "in" or "out" (that is, they are not binarily weighted) according to the user programming.

In one embodiment, the binary encoding of capacitor size for capacitors 92a–c comprises 31 units (plus zero) each and the encoding of capacitor size for capacitors 92d–e is 16 units each.

Switched capacitor block 90 is configured such that it can be used for the input stage of a switched capacitor biquad filter. When followed by a type B switched capacitor block, the combination of blocks provides a complete switched capacitor biquad (see FIGS. 14A and 14B).

Figure 9B:
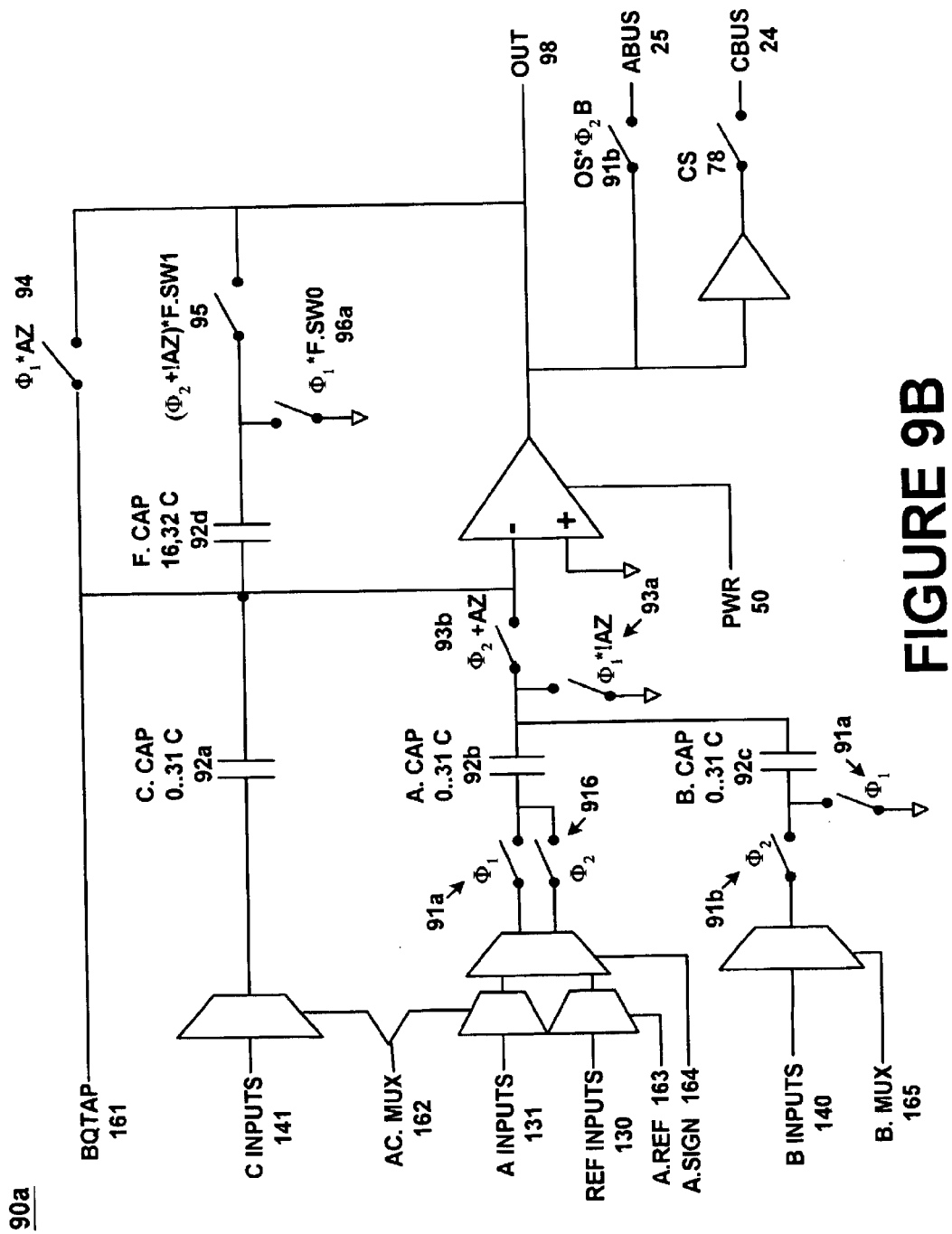
FIG. 9B is a schematic diagram of the switched capacitor block of FIG. 9A in accordance with one embodiment of the present invention.

FIG. 9B is a schematic diagram of a switched capacitor block 90a in accordance with one embodiment of the present invention. ABUS 25 is the output to the analog bus (e.g., buses 25a–d of FIG. 3). CBUS 24 is the output to the digital bus (e.g., buses 24a–d of FIG. 3). PWR 50 is a bit stream for encoding the power level for switched capacitor block 90a. CS 78 controls the output to CBUS 24.

Continuing with reference to FIG. 9B, BQTAP 161 is used when switched capacitor block 90a is used with a type B switched capacitor block to form a switched capacitor biquad (refer to FIGS. 14A and 14B below). AC.MUX 162 is for controlling the multiplexing of the inputs for both the C (CC) inputs 141 and the A (CA) inputs 131. A.REF 163 is for controlling the reference voltage inputs (REF 130). A.SIGN 164 controls the switch phasing of the switches on the bottom plate of the capacitor 92b. B.MUX 165 is for controlling the multiplexing of the inputs for the B (CB) inputs 140. OS (91b) gates the output to the analog column bus 25.

AZ (93a, 93b, 94, 95) controls the shorting of the inverting input of the op-amp. When shorted, the op-amp is basically a follower. The output is the op-amp offset. AZ also controls a pair of switches between the A and B branches and the summing node of the op-amp. If AZ is enabled, then the pair of switches is active.

F.SW0 (96) is used to control a switch in the integrator capacitor path, and connects the output of the op-amp to analog ground. F.SW1 (95) is used to control a switch in the integrator capacitor path. The state of F.SW1 is affected by the state of the AZ bit.

F.CAP (92d) controls the size of the switched feedback capacitor in the integrator. The A.CAP bits (92b) set the value of the capacitor in the A path, the B.CAP (92c) bits set the value of the capacitor in the B path, and the C.CAP (92a) bits set the value of the capacitor in the C path.

Figure 10:
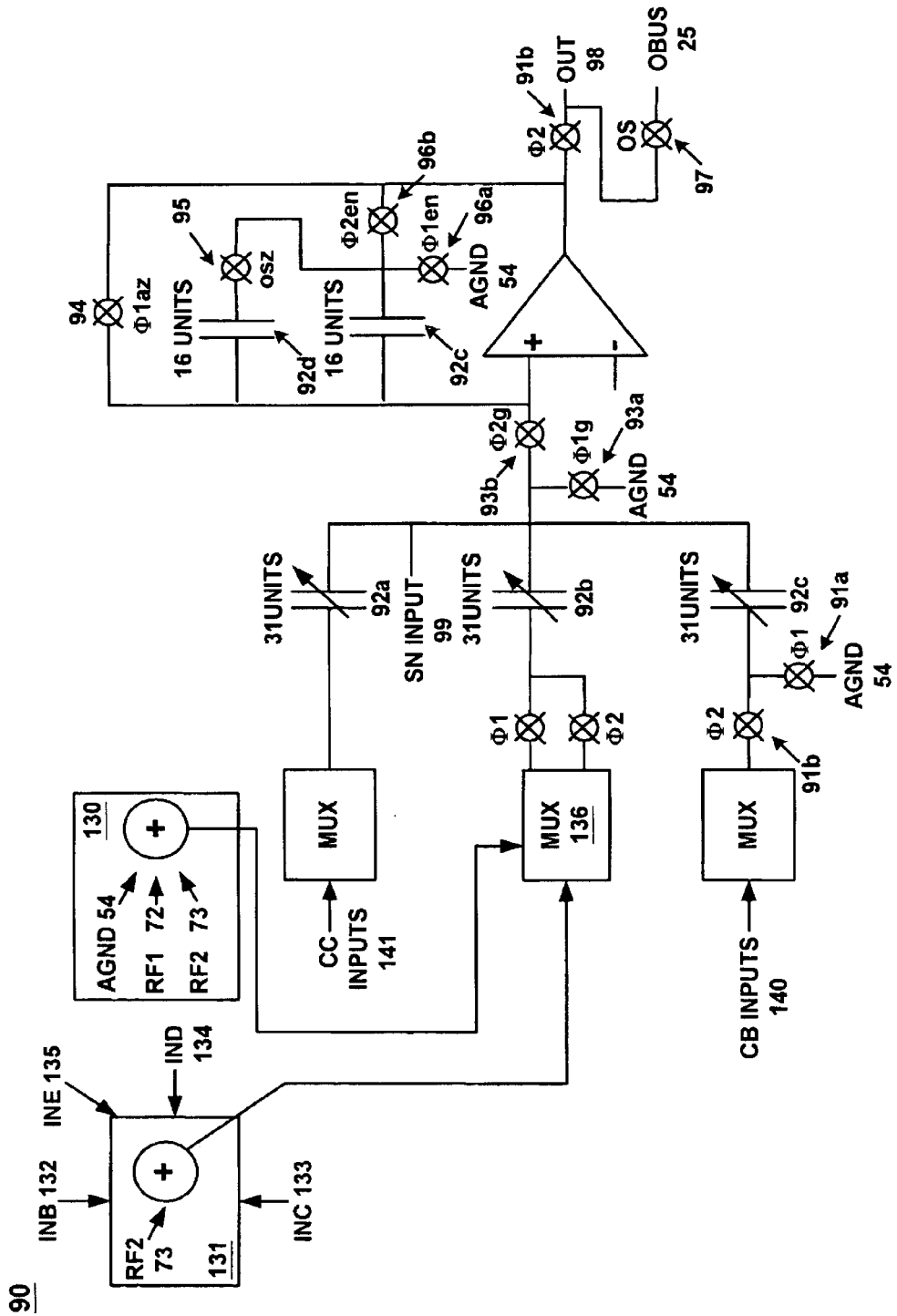
FIG. 10 shows one set of inputs into the switched capacitor block of FIG. 9A in accordance with one embodiment of the present invention.

FIG. 10 shows one set of inputs into one embodiment of a type A switched capacitor block 90 in accordance with the present invention. It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Referring to FIG. 10, REF inputs 130 includes the analog ground AGND 54 and reference voltages RF1 (REFLO) 72 and RF2 (REFHI) 73. CA inputs 131 can include inputs INB 132, INC 133, IND 134 and INE 135 from a continuous time block and/or switched capacitor block adjacent to switched capacitor block 90. CA inputs 131 can also include reference voltage RF2 (REFHI) 73 from a continuous time block and/or switched capacitor block adjacent to switched capacitor block 90. MUX 136 can be programmed so that either CA inputs 131 or REF inputs 130 are sampled on clock phase φ1, thereby allowing inverting or non-inverting configurations. The selection of RF1 (REFLO) 72 and RF2 (REFHI) 73 can be controlled by a comparator (see FIGS. 19 and 20).

Figure 11:
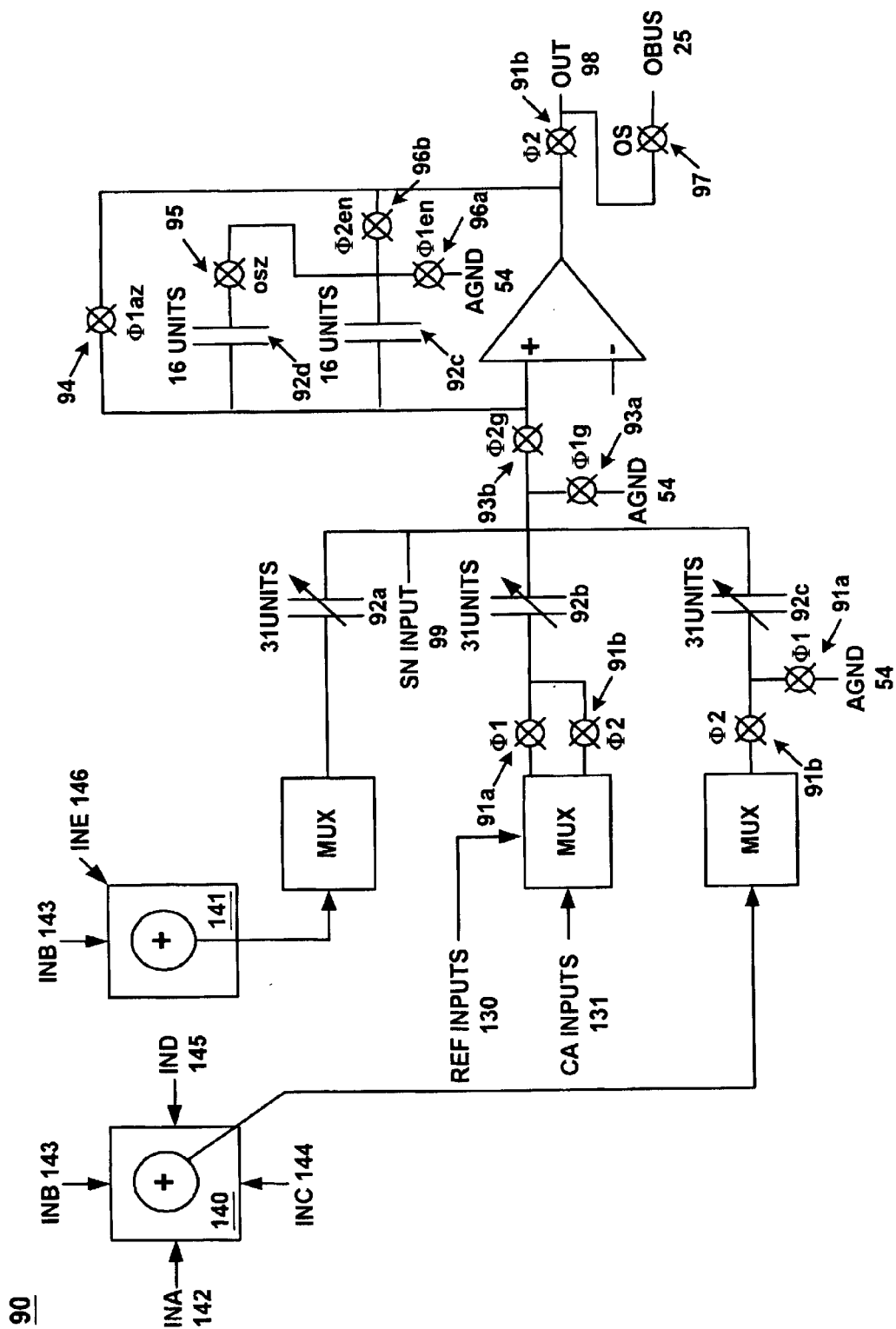
FIG. 11 shows the other set of inputs into the switched capacitor block of FIG. 9A in accordance with one embodiment of the present invention.

FIG. 11 shows the other set of inputs into the type A switched capacitor block 90 of FIG. 9A in accordance with the present invention. As previously mentioned, the inputs to switched capacitor block 90 are a function of the location of switched capacitor block 90 in the array of analog blocks 20 (FIGS. 2 and 3), and the inputs received by switched capacitor block 90 depend on the particular analog function being implemented.

With reference to FIG. 11, CB inputs 140 can include inputs INA 142, INB 143, INC 144 and IND 145 from a continuous time block and/or switched capacitor block adjacent to switched capacitor block 90. CC inputs 141 can include INB 143 and INE 146 from a continuous time block and/or switched capacitor block adjacent to switched capacitor block 90.

Figure 12A:
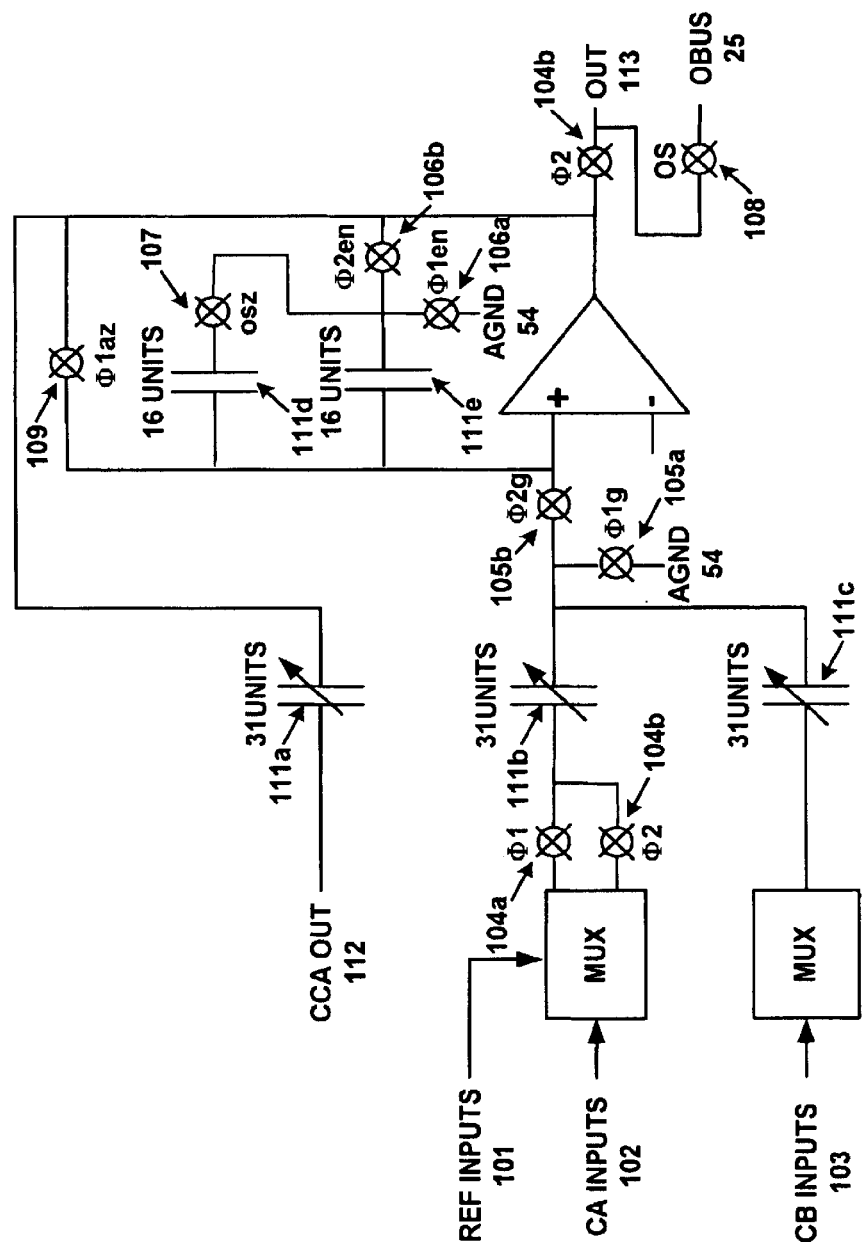
FIG. 12A is a block diagram of another embodiment of a switched capacitor block in accordance with the present invention.

FIG. 12A is a block diagram of another embodiment of a switched capacitor block 100 in accordance with the present invention. This embodiment of switched capacitor block 100 is referred to as a type B switched capacitor block. Switched capacitor block 100 exemplifies analog blocks 21f, 21h, 21i and 21k of FIGS. 2 and 3.

With reference to FIG. 12A, the present embodiment of switched capacitor block 100 receives reference (REF) inputs 101, CCAOUT outputs 112, and inputs from two different types of capacitor arrays, CA inputs 102 and CB inputs 103. The designations "CA" and "CB" are chosen to distinguish the two different types of capacitor arrays that are inputs to switched capacitor block 100, and they may be different from the CA inputs 131 and CB inputs 140 of FIG. 9A. REF inputs 101, CA inputs 102 and CB inputs 103 are described further in conjunction with FIG. 13. CCAOUT 112 is a non-switched capacitor feedback from the output. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

Continuing with reference to FIG. 12A, AGND 54 is the analog ground, OBUS (ABUS) 25 is the output to the analog bus (e.g., analog buses 25a–d of FIG. 3), and OUT 113 is an output from switched capacitor block 100 that may serve as an input to an adjacent switched capacitor block (refer to FIG. 3).

In the present embodiment, switched capacitor block 100 includes a multiplicity of switches 104a, 104b, 105a, 105b, 106a, 106b, 107, 108 and 109. Each of the switches 104a–b, 105a–b, 106a–b and 109 is assigned to a clock phase φ1 or φ2; that is, they are enabled or closed depending on the clock phase. Switches 105a–b, 106a–b and 109 are assigned to gated clocks and function in a known manner. Switches 107 and 108 are not clocked but instead are enabled or closed depending on the user's programming.

Switched capacitor block 100 also includes analog elements having characteristics that can be set and changed in response to the user's programming in accordance with the particular analog function to be implemented. In the present embodiment, switched capacitor block 100 includes programmable capacitors 111a–111e. In accordance with the present invention, the capacitance of capacitors 111a–e can be changed in response to the user's programming. In the present embodiment, the capacitors 111a–c are binarily weighted capacitors that allow the capacitor weights to be programmed by the user, while the capacitors 111d–e are either "in" or "out" (that is, they are not binarily weighted) according to the user programming. In one embodiment, the binary encoding of capacitor size for capacitors 111a–c comprises 31 units (plus zero) each and the encoding of capacitor size for capacitors 111d–e is 16 units each.

Switched capacitor block 100 is configured such that it can be used for the output stage of a switched capacitor biquad filter. When preceded by a type A switched capacitor block, the combination of blocks provides a complete switched capacitor biquad (see FIGS. 14A and 14B).

Figure 12B:
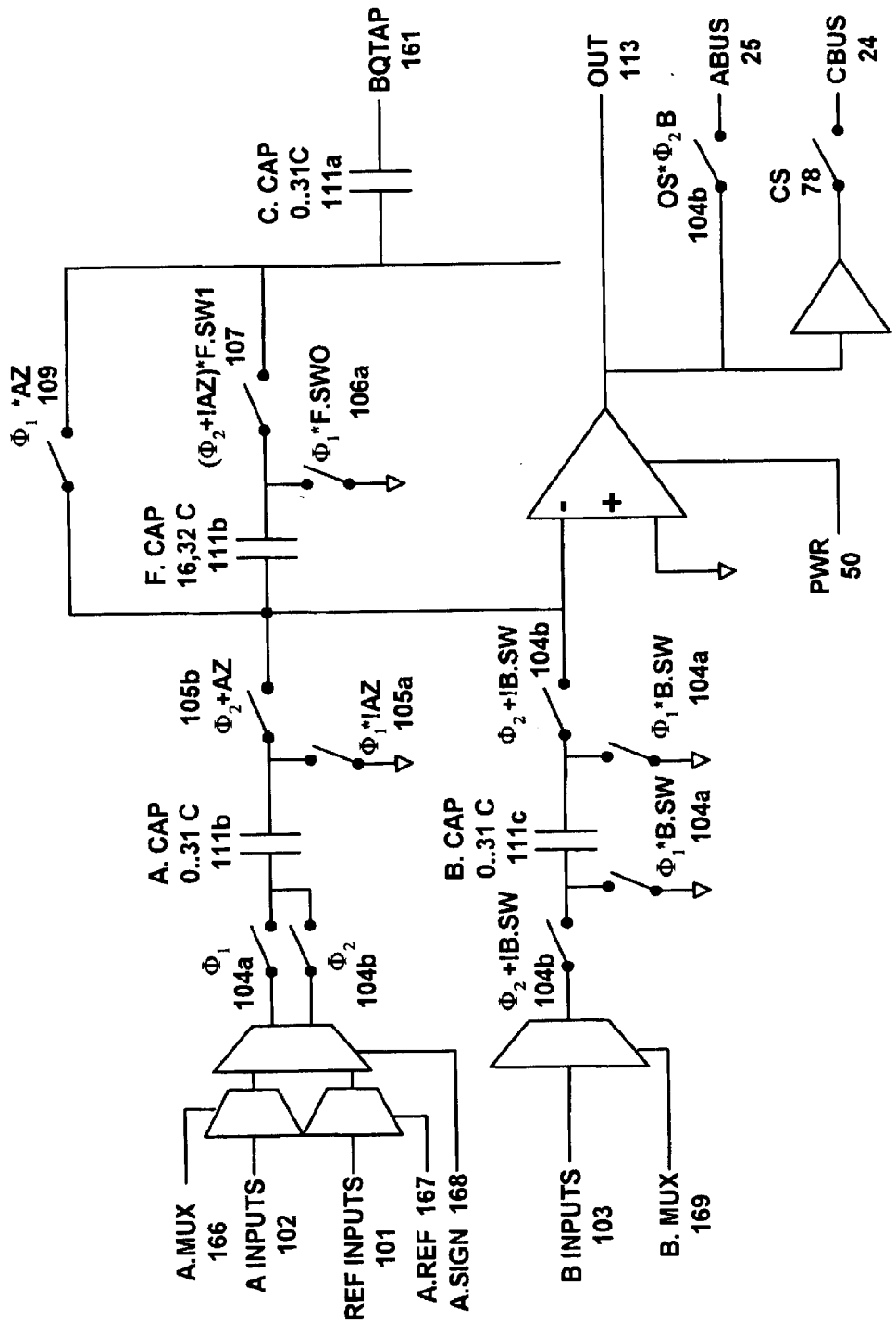
FIG. 12B is a schematic diagram of the switched capacitor block of FIG. 12A in accordance with one embodiment of the present invention.

FIG. 12B is a schematic diagram of a switched capacitor block 100a in accordance with one embodiment of the present invention. ABUS 25 is the output to the analog bus (e.g., buses 25a–d of FIG. 3). CBUS 24 is the output to the digital bus (e.g., buses 24a–d of FIG. 3). PWR 50 is a bit stream for encoding the power level for switched capacitor block 90a. CS 78 controls the output to CBUS 24. B.SW (104a, 104b) is used to control switching in the B (CB) branch.

Continuing with reference to FIG. 12B, BQTAP 161 is used when switched capacitor block 100a is used with a type A switched capacitor block to form a switched capacitor biquad (refer to FIGS. 14A and 14B below). A.MUX 166 is for controlling the multiplexing of the inputs for the A (CA) inputs 102. A.REF 167 is for controlling the reference voltage inputs (REF inputs 101). A.SIGN 168 controls the switch phasing of the switches on the bottom plate of the capacitor 111b; the bottom plate samples the input or the reference. B.MUX 169 is for controlling the multiplexing of the inputs for the B (CB) inputs 103. OS (104b) gates the output to the analog column bus 25.

AZ (105a, 105b, 107, 109) controls the shorting of the inverting input of the op-amp. When shorted, the op-amp is basically a follower. The output is the op-amp offset. AZ also controls a pair of switches between the A and B branches and the summing node of the op-amp. If AZ is enabled, then the pair of switches is active.

F.SW0 (106a) is used to control a switch in the integrator capacitor path, and connects the output of the op-amp to analog ground. F.SW1 (107) is used to control a switch in the integrator capacitor path. The state of F.SW1 is affected by the state of the AZ bit.

F.CAP (111d) controls the size of the switched feedback capacitor in the integrator. The A.CAP bits (111b) set the value of the capacitor in the A path, the B.CAP (111c) bits set the value of the capacitor in the B path, and the C.CAP (111a) bits set the value of the capacitor in the C path.

Figure 13:
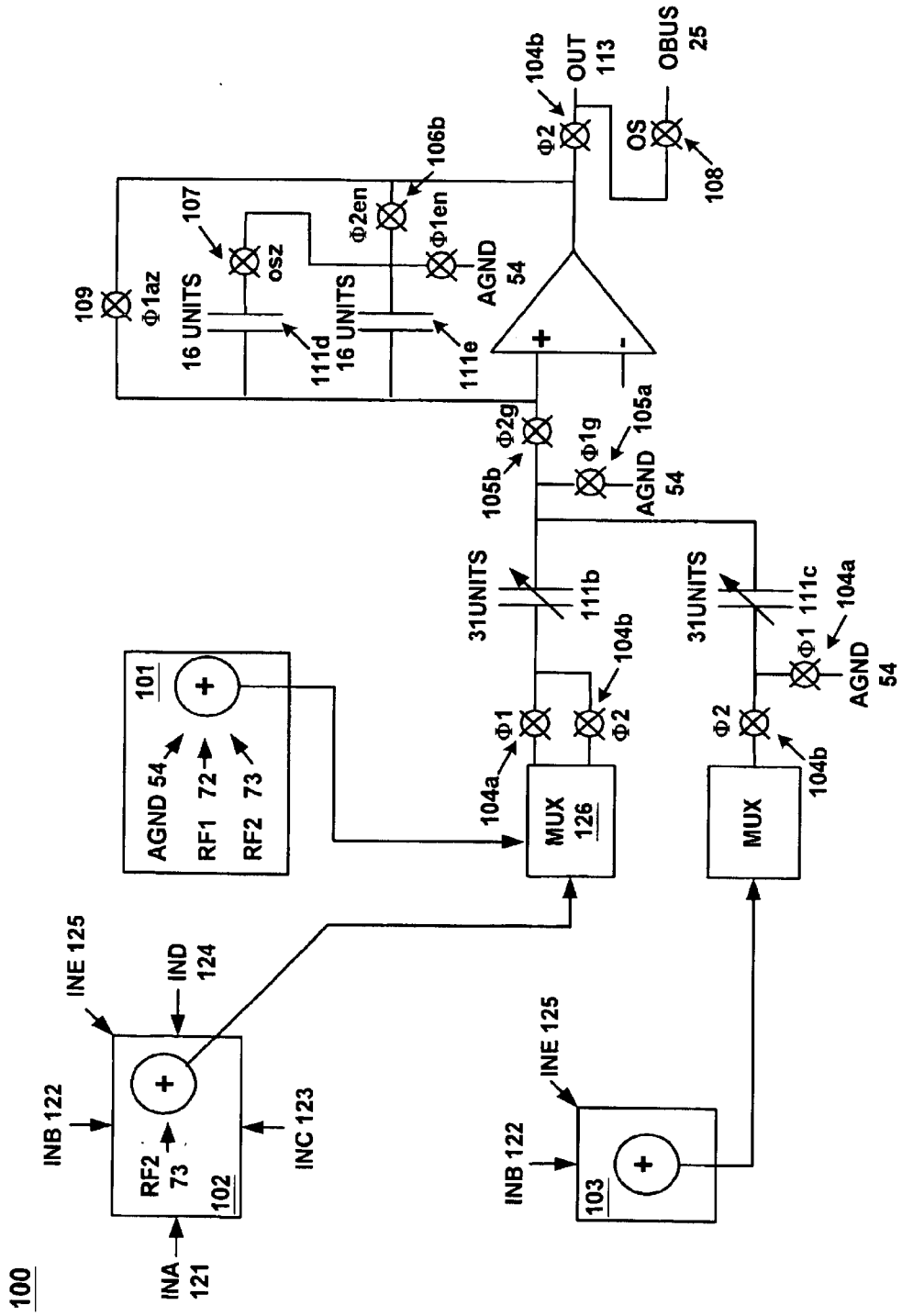
FIG. 13 shows the inputs into the switched capacitor block of FIG. 12A in accordance with one embodiment of the present invention.

FIG. 13 shows the inputs into one embodiment of a type B switched capacitor block 100 in accordance with the present invention. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

With reference to FIG. 13, REF inputs 101 includes the analog ground AGND 54 and reference voltages RF1 (REFLO) 72 and RF2 (REFHI) 73. CA inputs 102 can include inputs INA 121, INB 122, INC 123, IND 124 and INE 125 from a continuous time block and/or switched capacitor block adjacent to switched capacitor block 100. CB inputs 103 can include INB 122 and INE 125 from a continuous time block and/or switched capacitor block adjacent to switched capacitor block 100. MUX 126 can be programmed so that either CA inputs 102 or REF inputs 101 are sampled on clock phase φ1, thereby allowing inverting or non-inverting configurations.

Figure 14A:
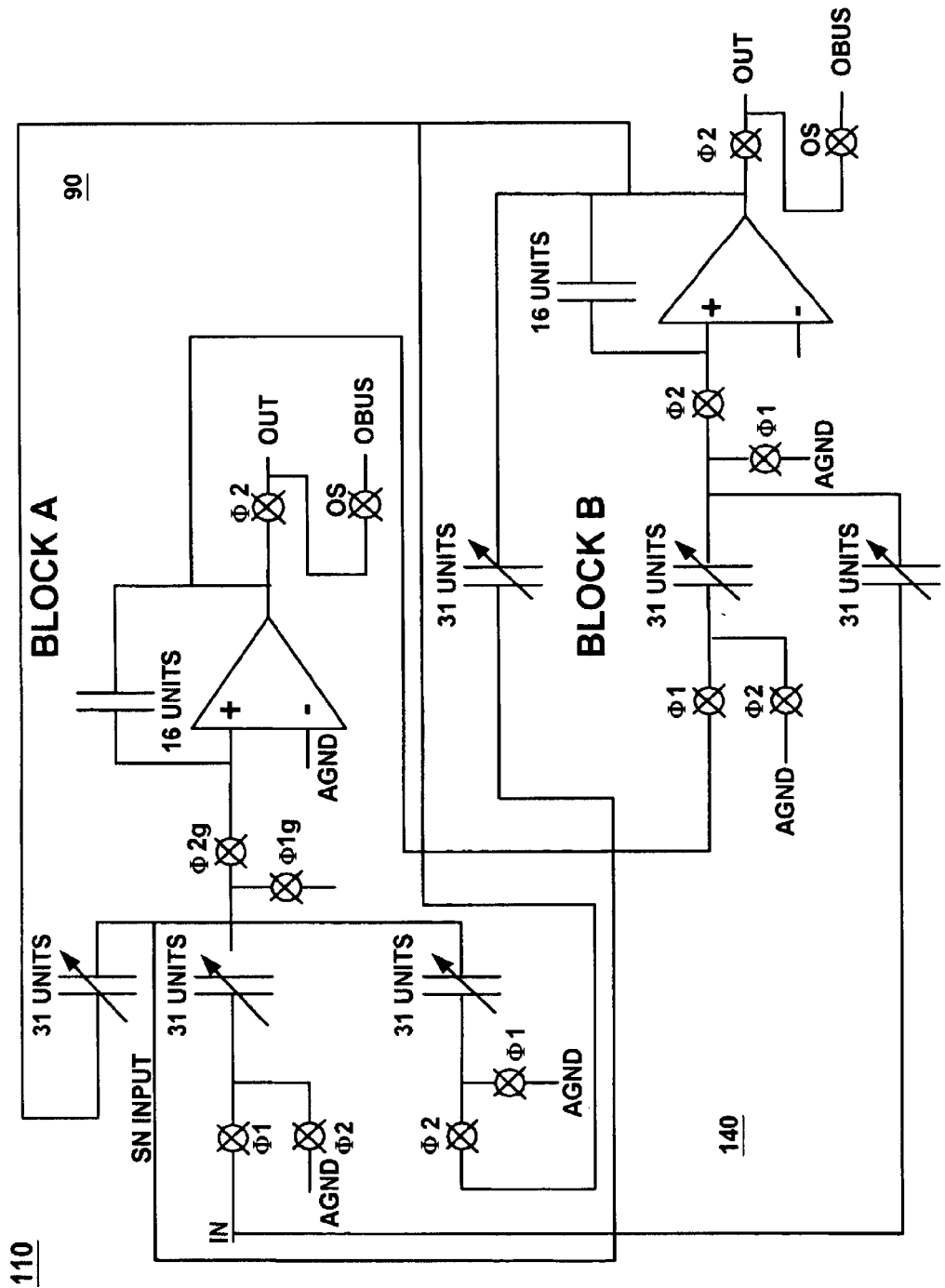
FIG. 14A is a block diagram showing one embodiment of a switched capacitor biquad in accordance with the present invention.
Figure 14B:
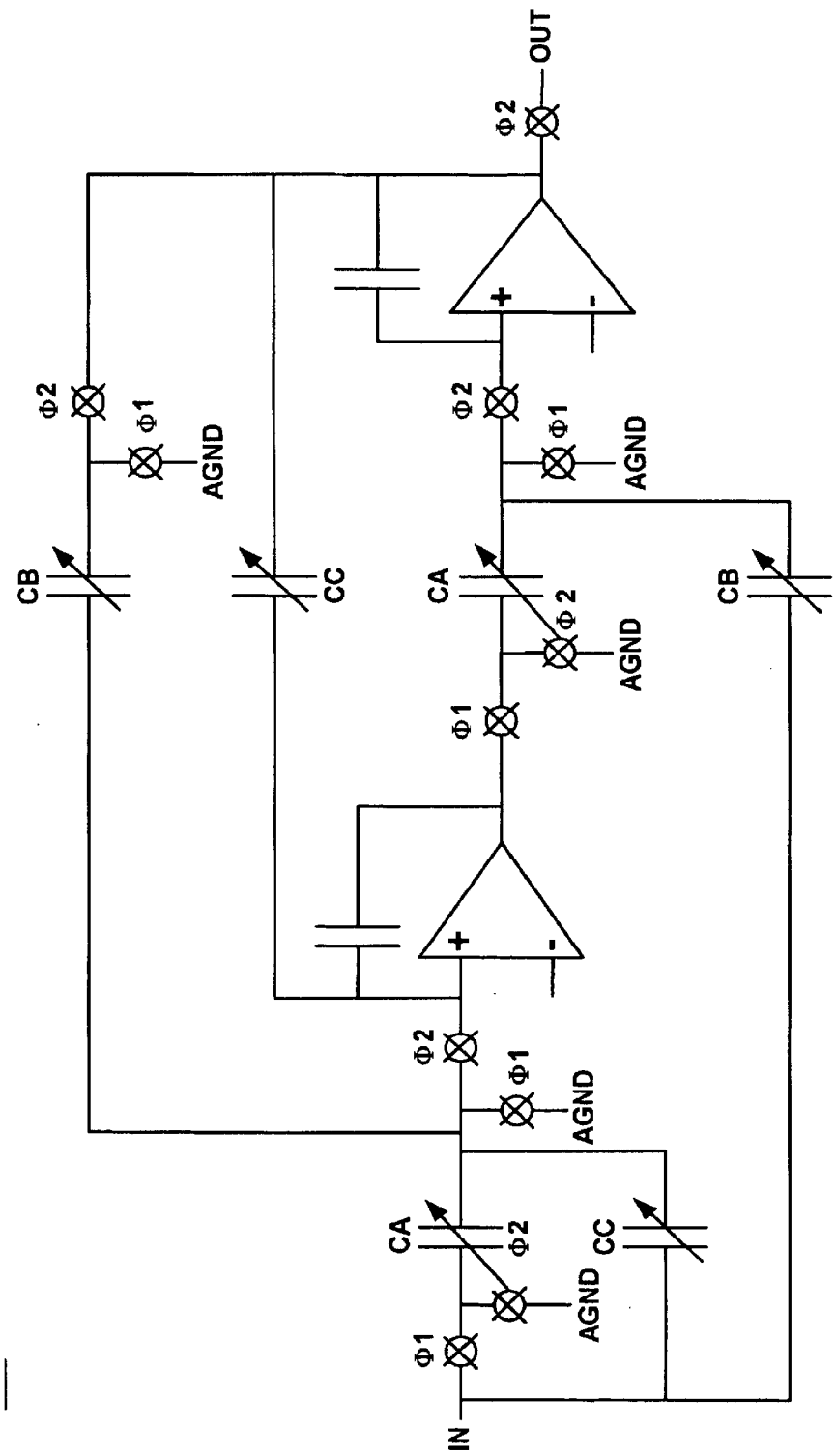
FIG. 14B is a schematic diagram showing one embodiment of a switched capacitor biquad in accordance with the present invention.

FIGS. 14A and 14B are diagrams showing one embodiment of a switched capacitor biquad 110 in accordance with the present invention. FIG. 14A shows the basic interconnection between a type A switched capacitor block 90 and a type B switched capacitor block 100. FIG. 14B is a schematic of a switched capacitor biquad 110 resulting from the interconnection of switched capacitor block 90 and switched capacitor block 100.

Programming Methodology and Architecture for a Programmable Analog System

FIGS. 15A and 15B are exemplary register banks 150a and 150b used by microcontroller 10 (FIG. 1) for configuring on-chip resources in accordance with one embodiment of the present invention. It is appreciated that a single register bank or more than two register banks may alternatively be used with the present invention.

Register banks 150a and 150b are used for "personalization" and "parameterization" of the on-chip resources. Personalization refers to the loading of configuration registers to achieve a particular analog function or a particular configuration (combination) of analog blocks. A configuration is realized as a set of data located in flash ROM 16 (FIG. 1) which is loaded into appropriate registers at boot time. Parameterization refers to the modification of registers to modify some aspect of the microcontroller and its functions. Parameterization can occur at boot time and, combined with personalization, achieves a default selection of parameters and characteristics. Parameterization can also occur during program execution to change the operation of the microcontroller. For example, a set of analog blocks can be personalized to form a timer, which is then parameterized to specify an output destination and period. In another example, switched capacitor blocks are personalized to form a bandpass filter, which is parameterized for frequency and bandwidth.

Continuing with reference to FIGS. 15A and 15B, in the present embodiment, each of the register banks 150a and 150b contains 256 bytes. A user can select between the two banks by setting a bit in another configuration register.

In the present embodiment, up to four configuration registers are assigned to each of the analog blocks 20 (FIG. 1), although it is appreciated that more or less than four configuration registers can also be used. The settings in these registers are used for selectively coupling analog blocks, for specifying characteristics of the analog elements in each of the analog blocks, and for specifying the inputs and outputs for the analog blocks. The information in the registers can be dynamically changed to couple different combinations of analog blocks, to specify different characteristics of the analog elements, or to specify different inputs and outputs for the analog blocks, thereby realizing different analog functions using the same array of analog blocks. The configuration registers are described further in conjunction with FIGS. 17, 18A and 18B.

In the present embodiment, the configuration registers are mapped from the register banks 150a and 150b of FIGS. 15A and 15B, respectively. The registers are designated in register banks 150a and 150b as "ACAxxCRx" for the continuous time blocks, "ASAxxCRx" for the type A switched capacitor blocks, and "ASBxxCRx" for the type B switched capacitor blocks. The address for each of the registers is also shown. For example, analog block ACA00CR0 refers to the first configuration register for analog block ACA00 21a (FIG. 2) with address 071. Note that FIGS. 15A and 15B only show three registers for each of the continuous time blocks, with one additional address reserved for each continuous time block.

Thus, in the present embodiment, a contiguous 256-byte memory space (e.g., register banks 150a and 150b of FIGS. 15A and 15B) is assigned to and under control of the microcontroller 10 (FIG. 1). Accordingly, register banks 150a and 150b can each specify 256 eight-bit addresses for writing data. Of these 256 addresses, in the present embodiment, 48 are assigned to the configuration registers for analog blocks 20 of FIG. 2 (in this embodiment, there are 12 analog blocks, with up to four configuration registers each). The configuration registers are thereby memory mapped from the register banks 150a and 150b. To microcontroller 10, the configuration registers appear to reside contiguously in memory, when in actuality the configuration registers may reside in disparate locations anywhere on microcontroller 10 (or in a location accessible by microcontroller 10).

Figure 16:
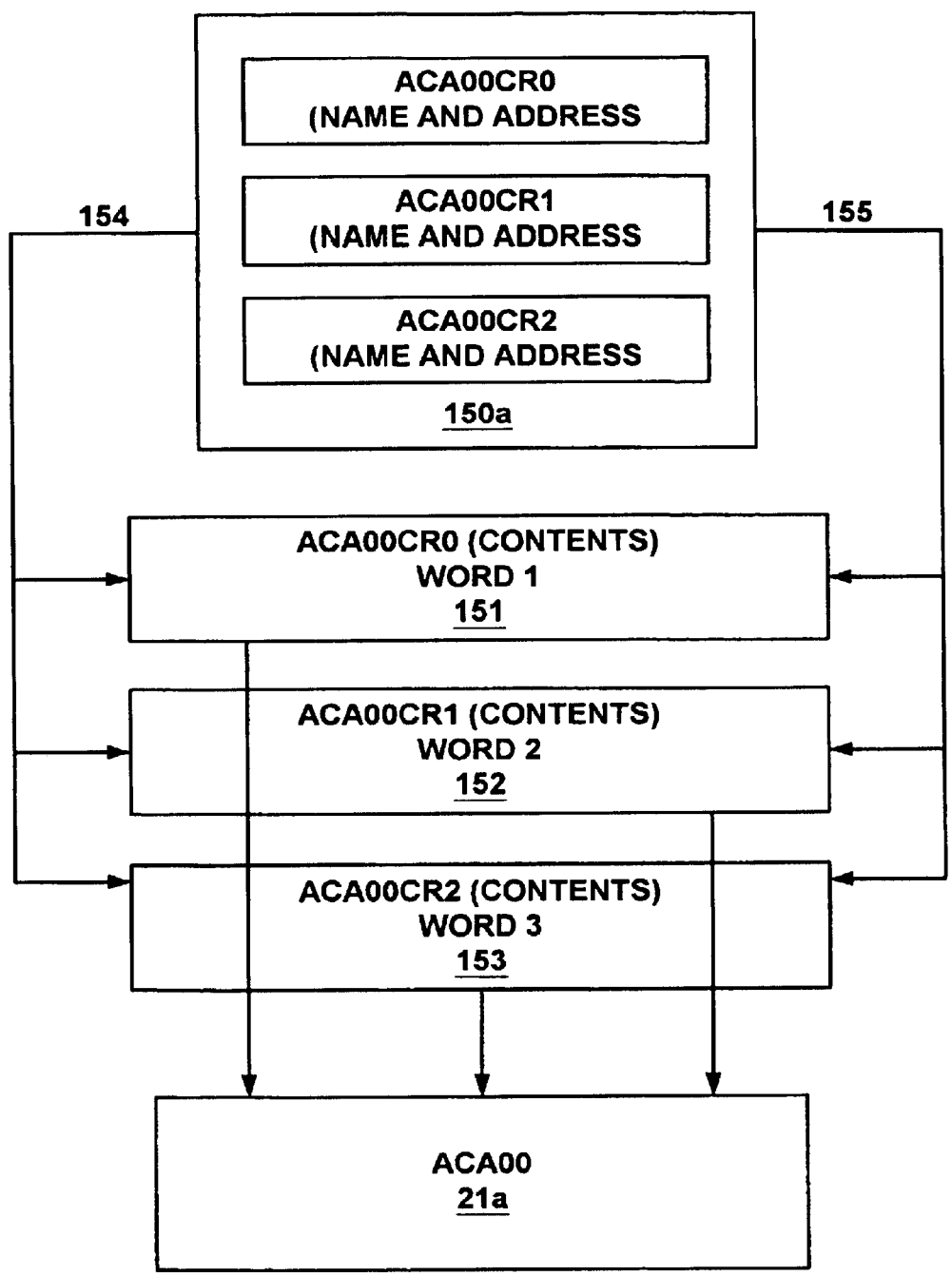
FIG. 16 is a data flow diagram showing registers and an analog block in accordance with one embodiment of the present invention.

FIG. 16 is a diagram exemplifying the relationship between registers and analog blocks in accordance with one embodiment of the present invention. Only the portion of register bank 150a that includes the memory mapping of the three configuration registers ACA00CR0, ACA00CR1, and ACA00CR2 for analog block ACA00 21a (a continuous time block) is shown. As mentioned above, any number of configuration registers can be assigned to each analog block. Four configuration registers are typically assigned to each switched capacitor block.

Register bank 150a is under the control of microcontroller 10 (FIG. 1). Register bank 150a includes the names of the configuration registers and their respective addresses. The configuration registers themselves may be physically located anywhere on or accessible by microcontroller 10. In one embodiment, the configuration registers are coupled to their respective analog blocks (e.g., configuration registers ACA00CR0, ACA00CR1, and ACA00CR2 are coupled to analog block ACA00 21a), while in another embodiment the configuration registers are integrated into their respective analog blocks.

In the present embodiment, each of the configuration registers ACA00CR0, ACA00CR1, and ACA00CR2 includes up to eight bits, designated as word 1 151, word 2 152 and word 3 153. Each of the bits, or the combination of the bits, is for implementing a particular analog function, as described more fully below in conjunction with FIGS. 17, 18A and 18B. In one embodiment, each of the configuration registers is written to using an address bus (e.g., address bus 154) and a data bus (e.g., data bus 155).

FIG. 17 describes one embodiment of the contents of the registers for configuring a continuous time block (e.g., continuous time block 40 of FIG. 4) in accordance with the present invention. In this embodiment, only three registers are used, although a different number of registers can be used in accordance with the present invention. Each bit or combination of bits in the registers is used to implement an analog function by selectively coupling analog blocks, by specifying characteristics of the analog elements in each of the analog blocks, and/or by specifying the inputs and outputs for the analog blocks. In the embodiment of FIG. 2, there are four continuous time blocks; the configuration registers for each of these continuous time blocks are uniquely specified, so that each continuous time block may be uniquely configured.

With reference to FIG. 17 as well as to FIG. 4A, the F0, F1 and F2 bits specify the F inputs 43 to continuous time block 40. The three bits F0, F1 and F2 in combination can be used to specify eight different states. Similarly, the three bits P0, P1 and P2 and the three bits N0, N1 and N2 are for specifying the P inputs 41 and N inputs 42.

The G bit is for setting either a gain or loss (attenuation) configuration for the output tap, by specifying either a positive function or a negative function. The bits designated N/C are not connected (not used).

Figure 19:
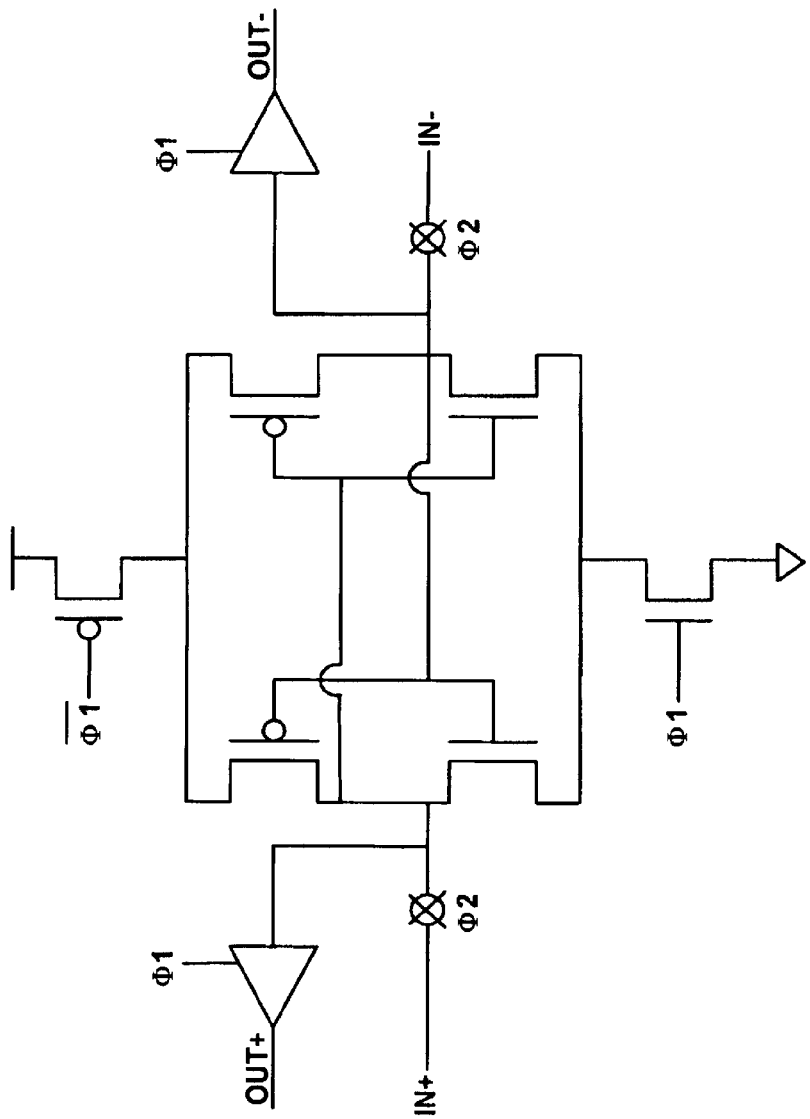
FIG. 19 is a schematic diagram showing one embodiment of a comparator cell in accordance with the present invention.
Figure 20:
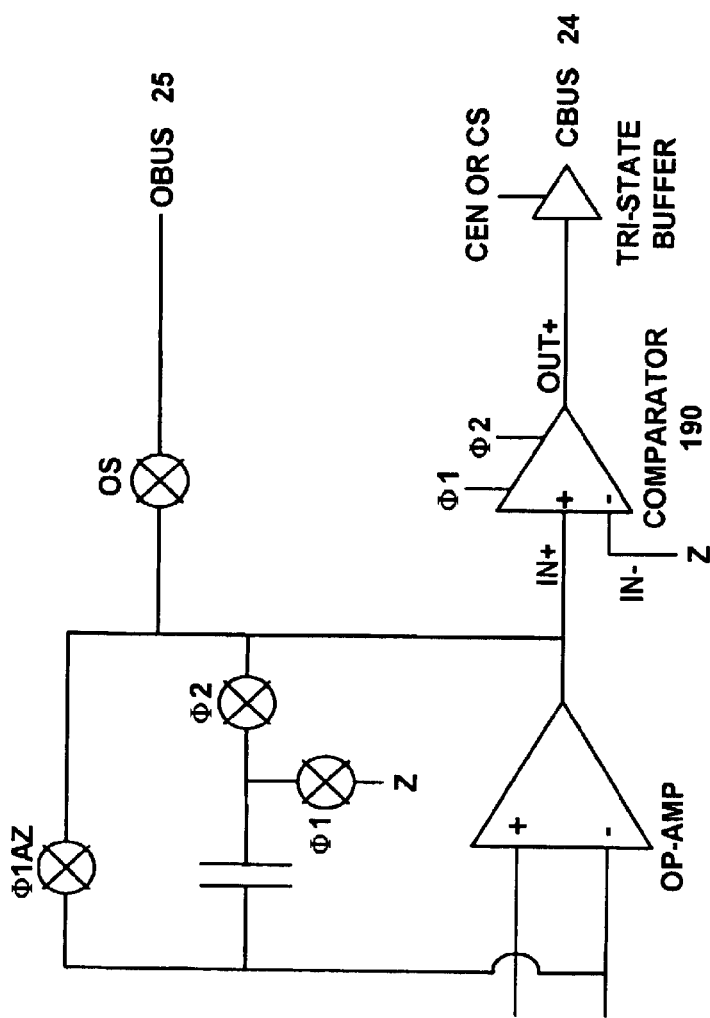
FIG. 20 is a schematic diagram showing one embodiment of a comparator connection in accordance with the present invention.
Figure 21A:
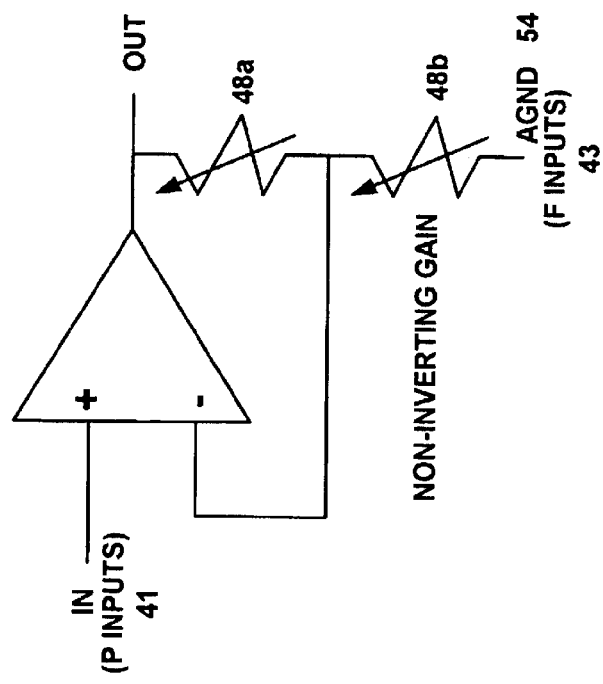
FIGS. 21A, 21B, 21C, 21D, 21E, 21F, 21G and 21H illustrate exemplary applications using continuous time blocks in accordance with the present invention.
Figure 21B:
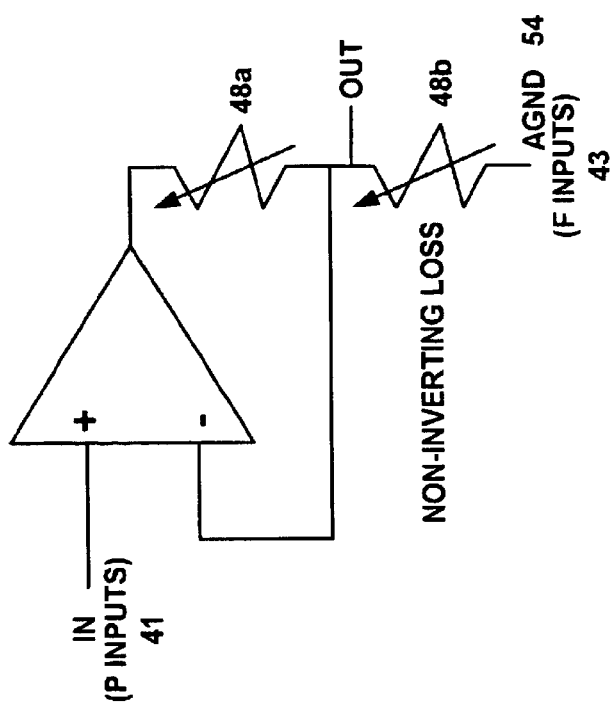
Figure 21C:
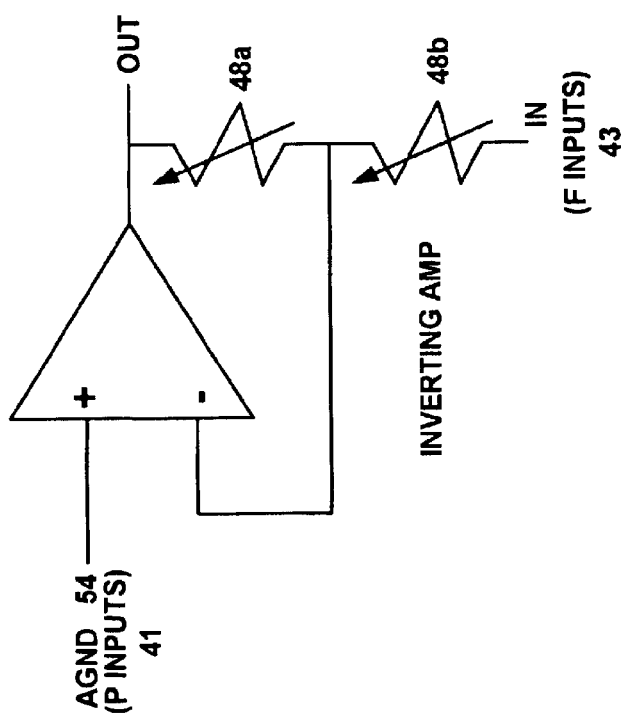
Figure 21D:
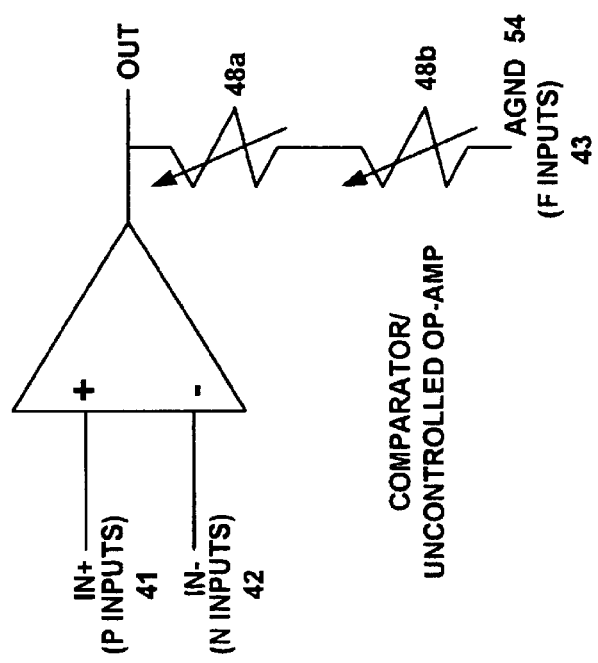
Figure 21E:
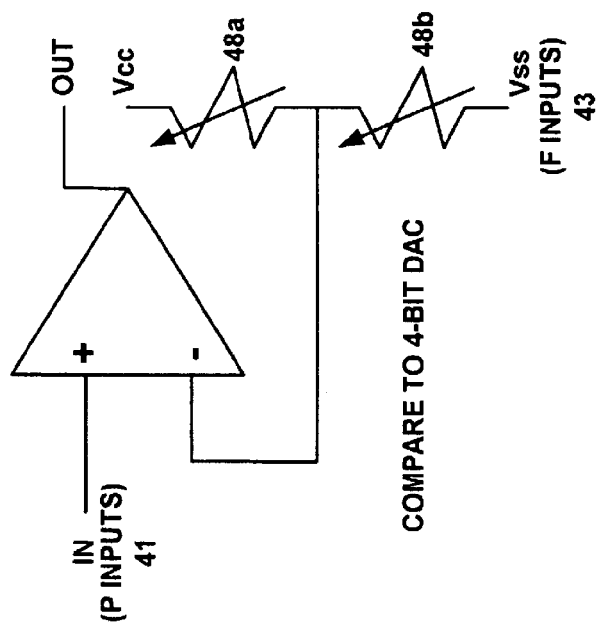
Figure 21F:
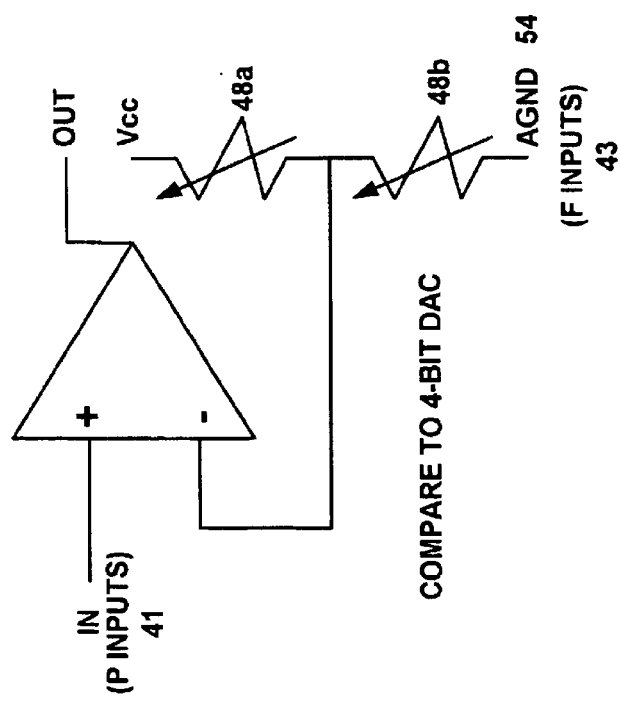
Figure 21G:
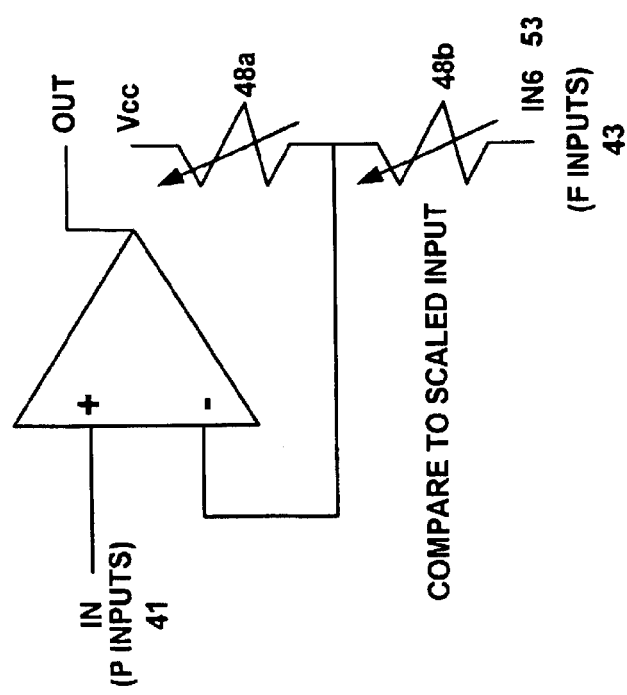
Figure 21H:
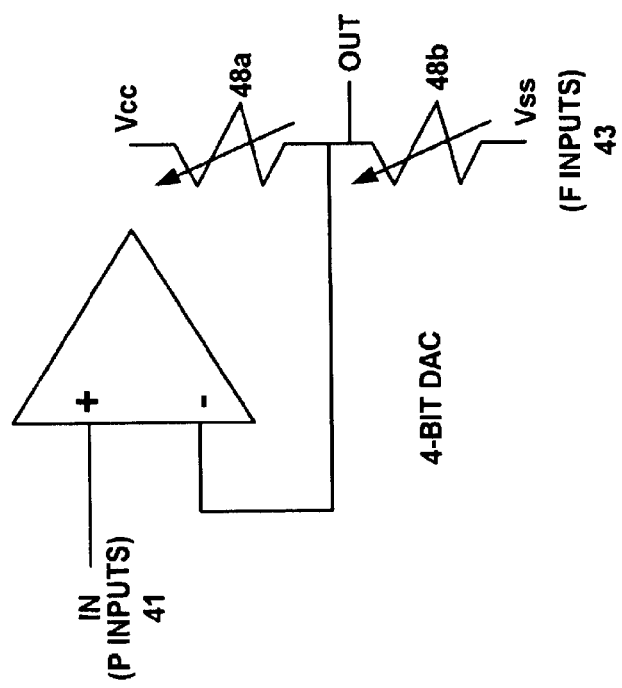
Figure 22A:
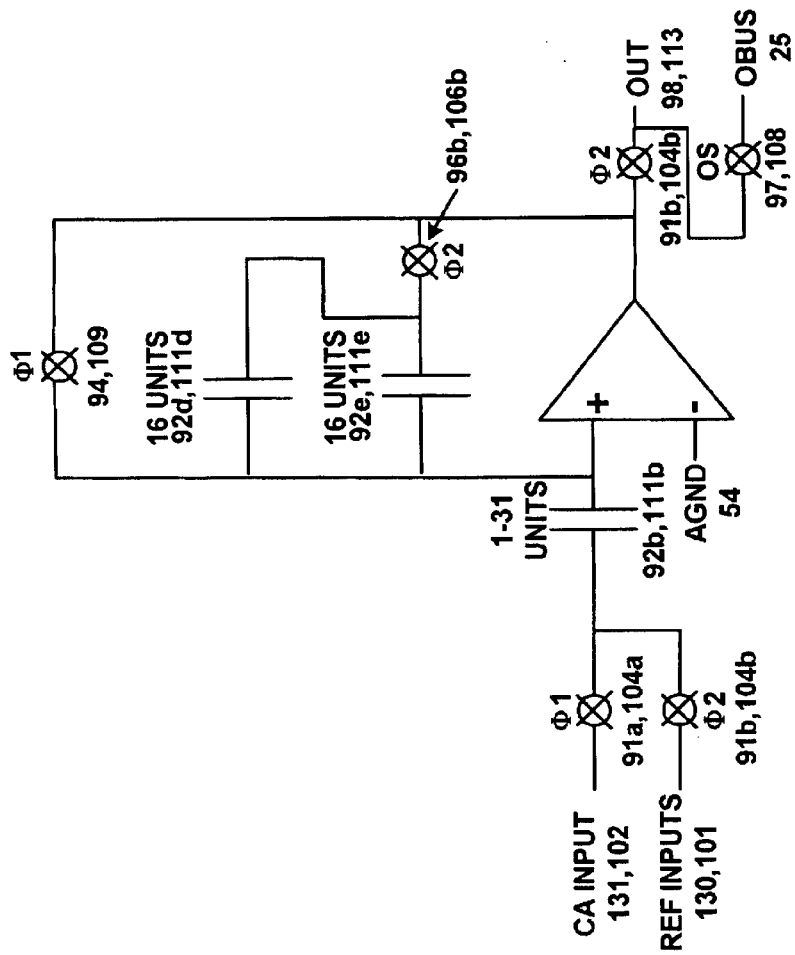
FIGS. 22A, 22B, 22C, 22D, 22E, 22F, 22G, 22H, 22I, 22J and 22K illustrate exemplary applications using switched capacitor blocks in accordance with the present invention.
Figure 22B:
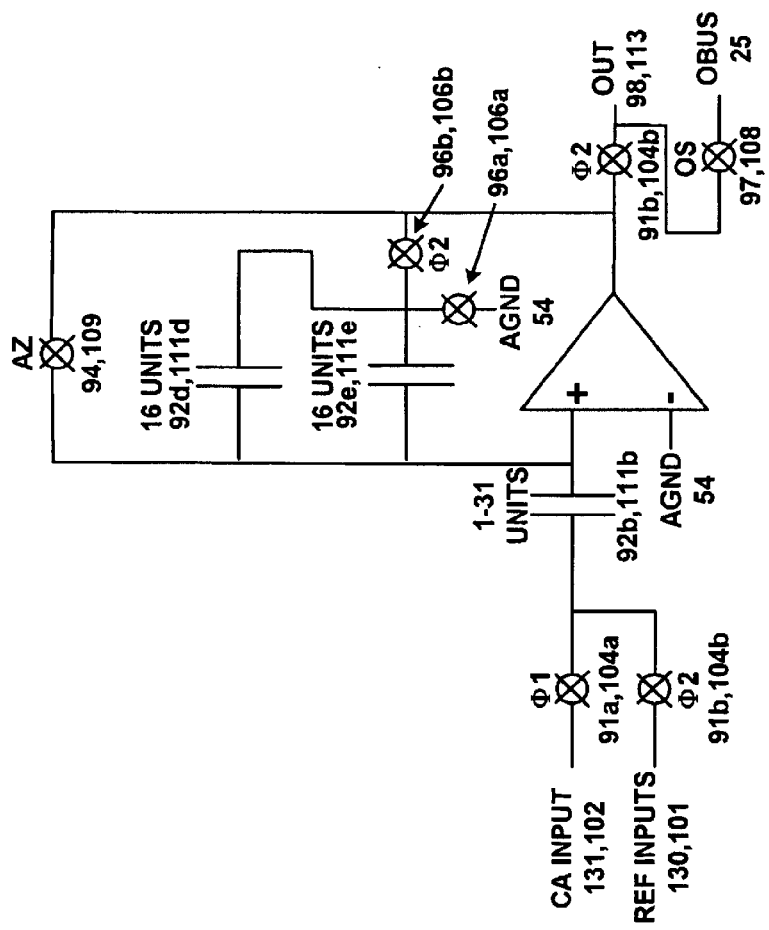
Figure 22C:
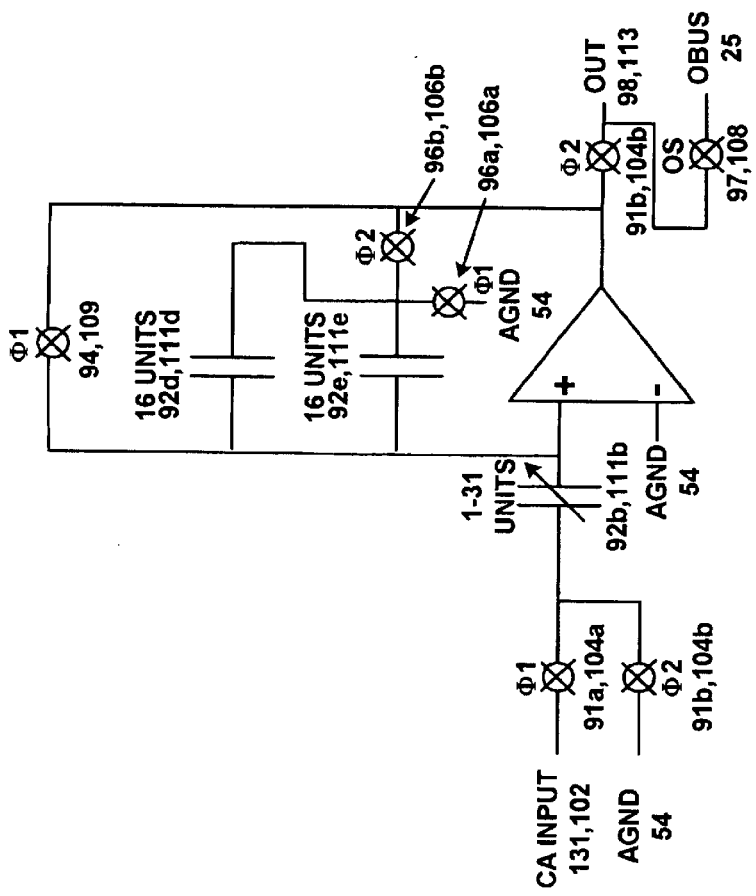
Figure 22D:
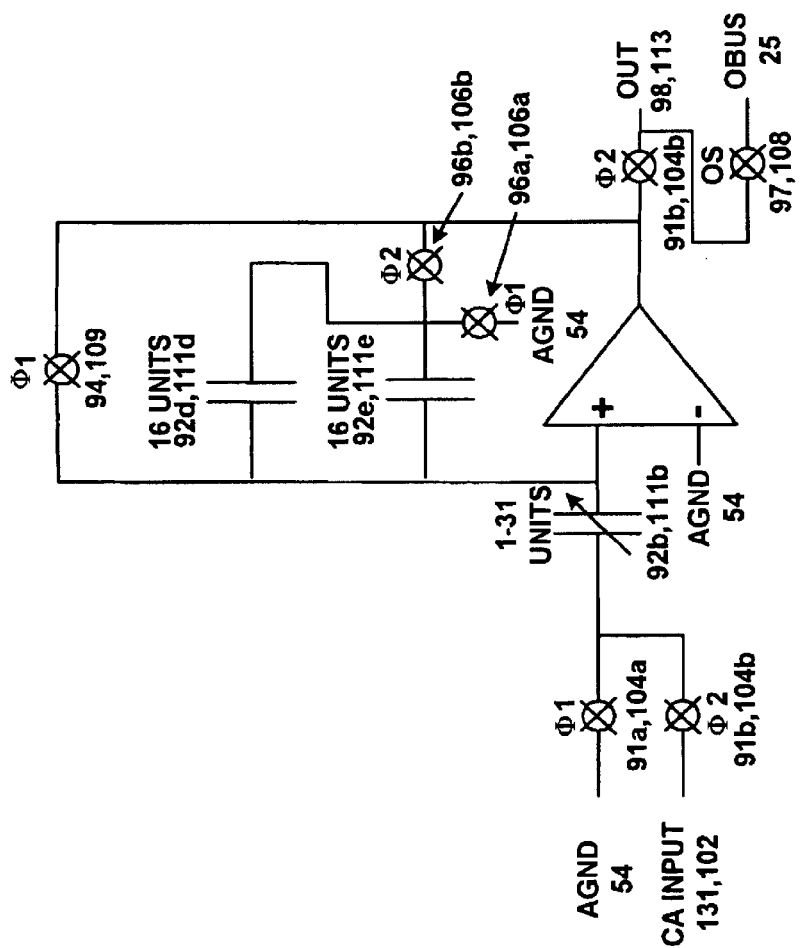
Figure 22E:
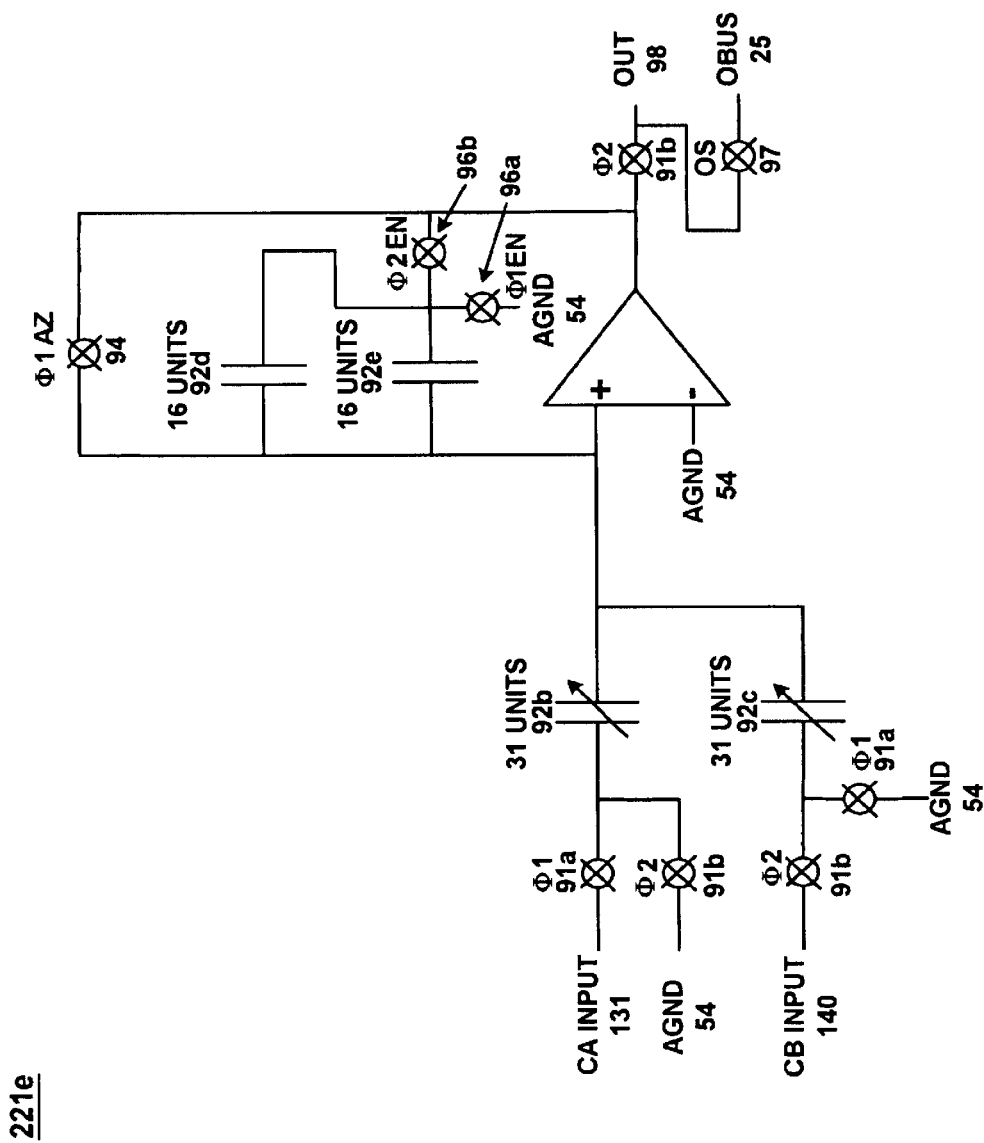
Figure 22F:
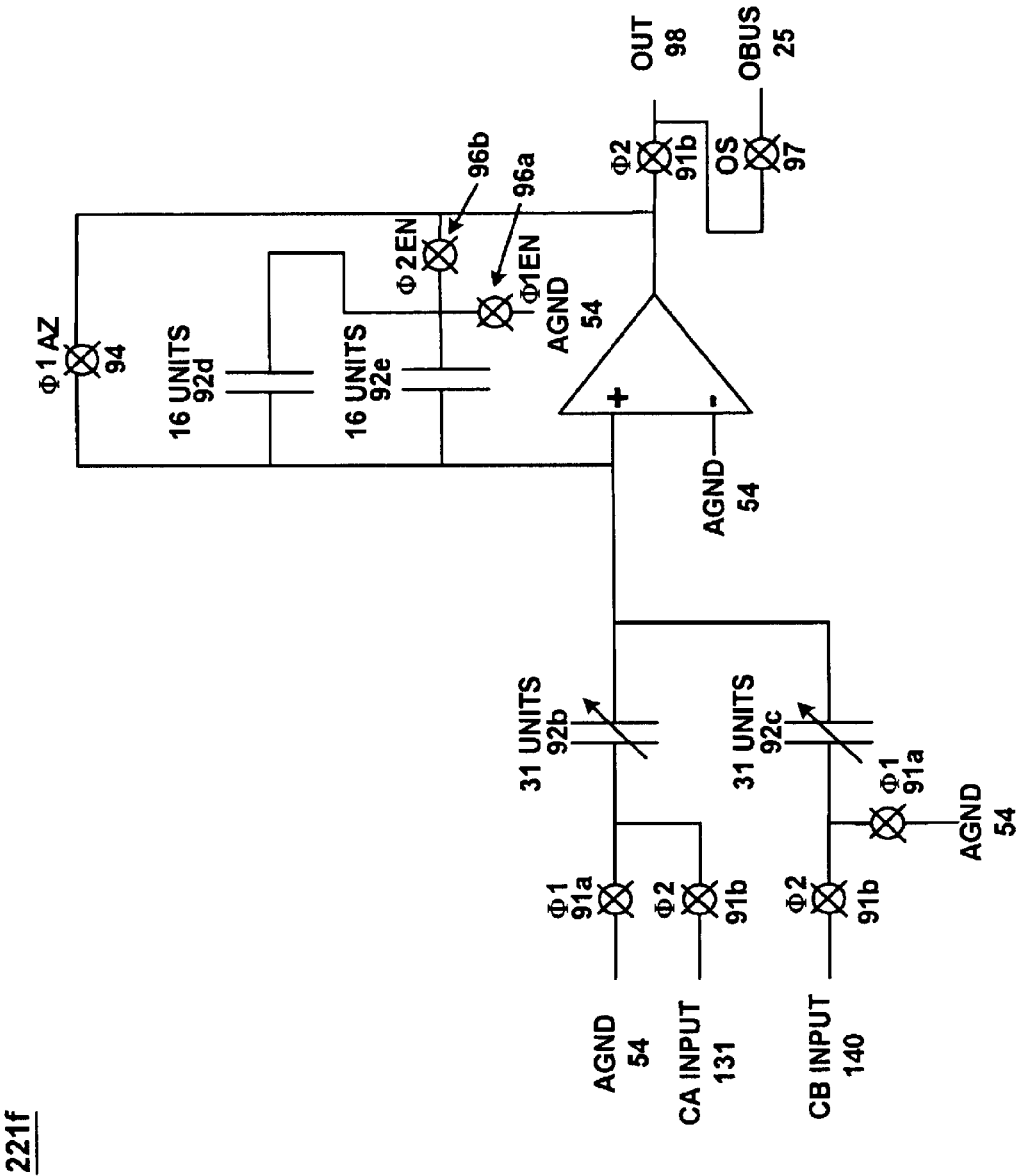
Figure 22G:
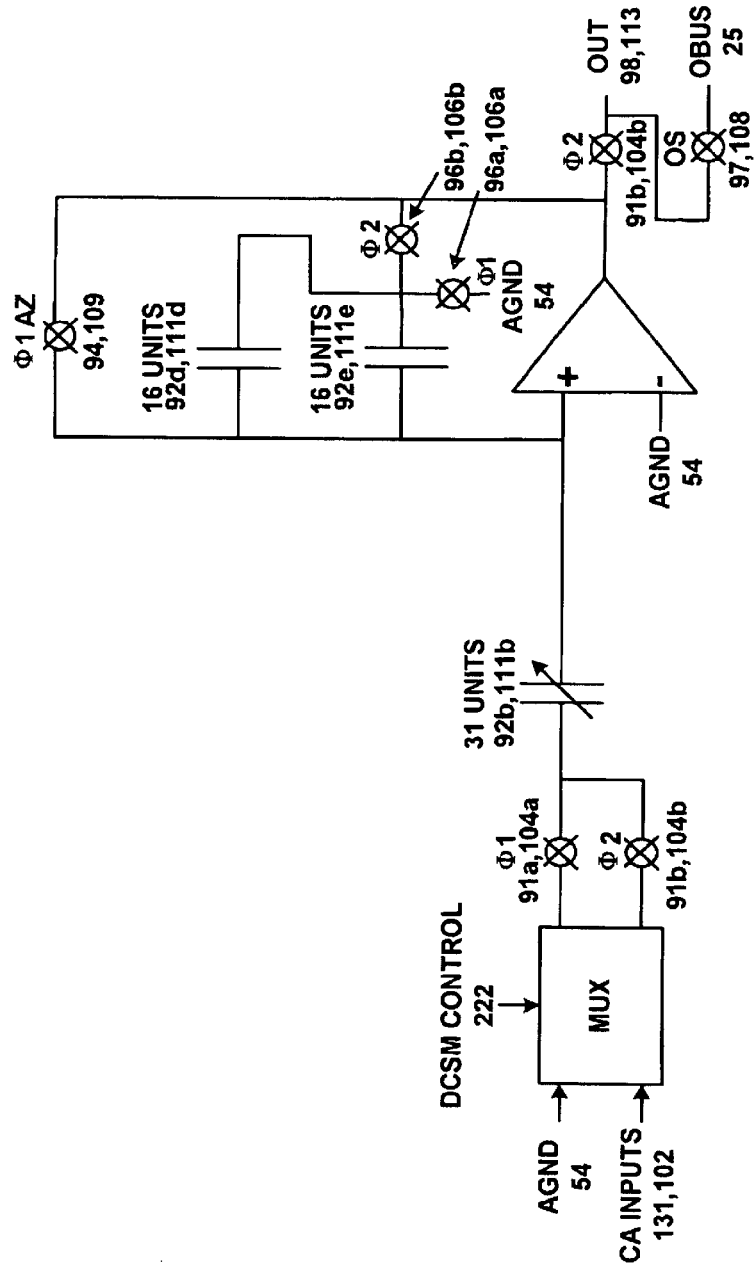
Figure 22H:
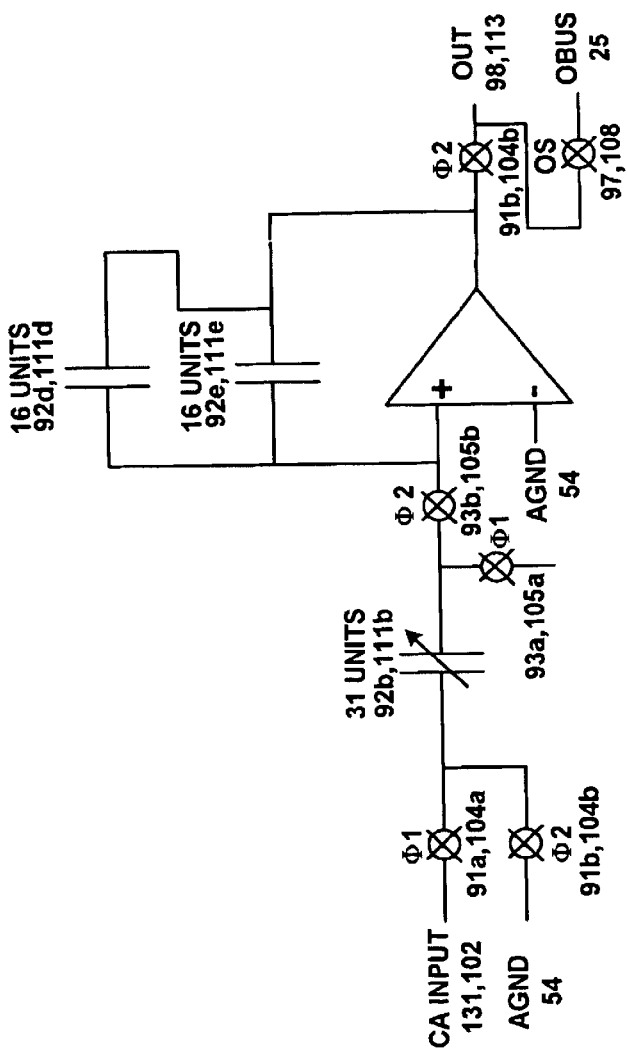
Figure 22I:
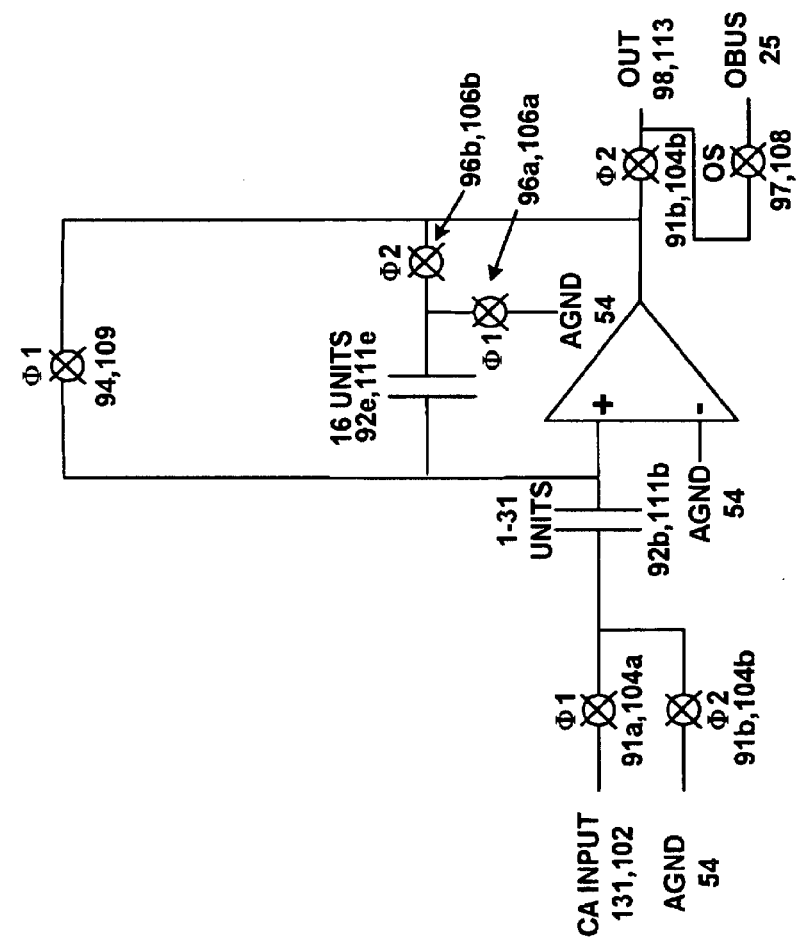
Figure 22J:
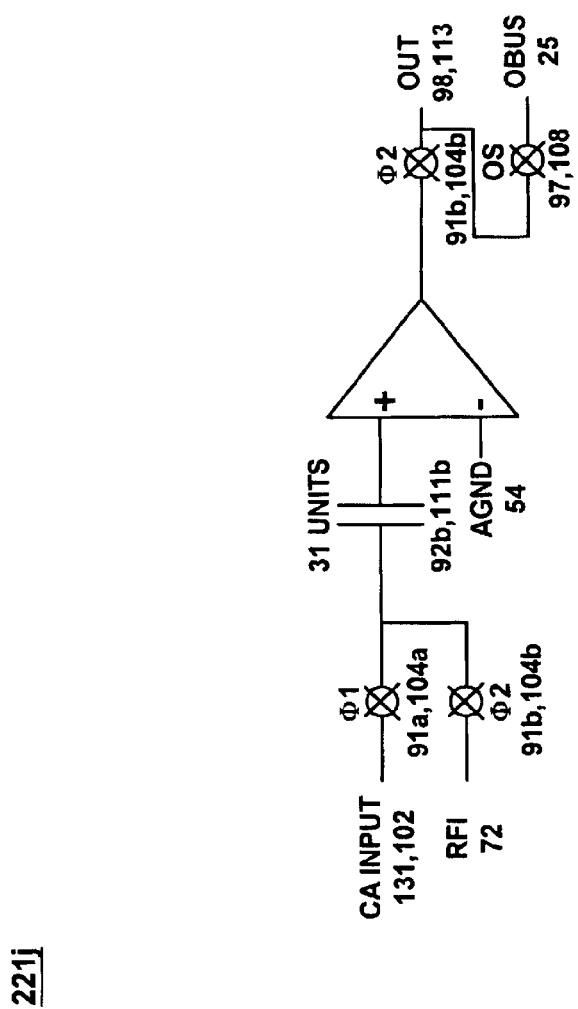
Figure 22K:
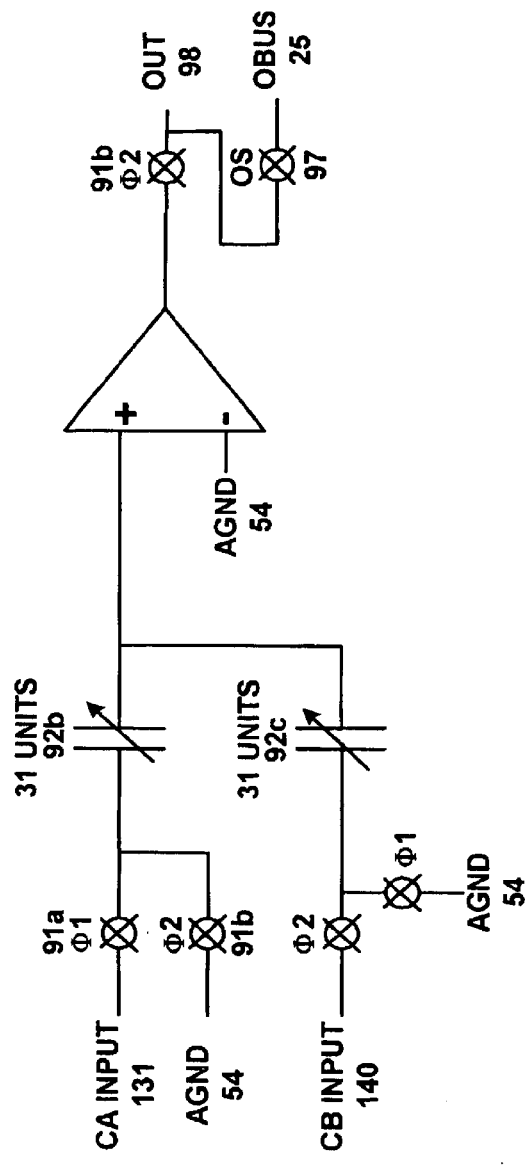

The CEN bit is a comparator-enable bit. An operational amplifier (op-amp) typically includes a compensating capacitor; however, the compensating capacitor can slow operation if the op-amp is to be used as a comparator. The CEN bit is used to bypass the compensating capacitor. Refer also to FIGS. 19 and 20, below.

The OS bit of FIG. 17 is to enable output onto the analog bus for the column of analog blocks (e.g., analog buses 25a–d of FIG. 3), because only one block in a column can drive the analog bus at a time.

The combination of S0 and S1 bits of FIG. 17 is for selecting one of the four possible power levels for running continuous time block 40 (FIG. 4). The combination of the R0, R1, R2 and R3 bits is for selecting one of the 16 resistor taps, to change the resistance values of the programmable resistors 48a and 48b (FIG. 4), and to change the ratio of the resistances of these two resistors.

FIG. 18A describes one embodiment of the contents of the registers for configuring switched capacitor block 90 of FIG. 9 (a type A switched capacitor block) in accordance with the present invention. FIG. 18B describes one embodiment of the contents of the registers for configuring the switched capacitor block 100 of FIG. 10 (a type B switched capacitor block) in accordance with the present invention. In these embodiments, four registers are used for each analog block, although a different number of registers can be used in accordance with the present invention. Each bit or combination of bits in the registers is used to implement an analog function by selectively coupling analog blocks, by specifying characteristics of the analog elements in each of the analog blocks, and/or by specifying the inputs and outputs for the analog blocks. In the embodiment of FIG. 2, there are four type A and four type B switched capacitor blocks; the configuration registers for each of these blocks are uniquely specified, so that each type A and type B block may be uniquely configured.

With reference to FIGS. 18A and 18B, the bits A0–A4, B0–B4 and C0–C4 are for selecting one of the states (capacitances) for the programmable capacitors 92a–e (FIG. 9) or 111a–e (FIG. 10). The S bit is a sign bit controlling the inversion of the CA inputs 131 (FIG. 9) or 102 (FIG. 10); that is, the S bit changes the phase of the switches to invert the CA input.

Continuing with reference to FIGS. 18A and 18B, the PS bit is for selecting the clock phase during which a switched capacitor block will sample data. Each switched capacitor block 90 or 100 (FIGS. 9 and 10, respectively) works off of two phases. The output is valid during one of these phases, while each block is sampling input during the other phase. For example, the output may be valid during φ2 and the input might be sampled on φ1. Continuing with the example, in a configuration in which two switched capacitor blocks are coupled, if they are both sampling data during φ1 and outputting data during φ2, data cannot be passed from one block to another. Therefore, the phases for one of the blocks need to be swapped so that when one of the blocks is outputting data in one phase, the other block is sampling that data in that phase. Accordingly, the PS bit is used for specifying what phase a switched capacitor block will sample data.

The OSZ, DO1, DO2 and AZ bits of FIGS. 18A and 18B are for controlling the gated switches in switched capacitor blocks 90 and 100 of FIGS. 9 and 10. The I11 and I12 bits of FIG. 18A, and the I11, I12 and I13 bits of FIG. 18B, are for selecting the CA inputs 131 (FIG. 9) or 102 (FIG. 10). The IS21 and IS22 bits of FIG. 18A, and the MB bit of FIG. 18B, are for selecting the CB inputs 140 and 103 (FIGS. 9 and 10, respectively). The IS3 bit of FIG. 18A is for selecting the CC input 141 of FIG. 9.

Referring still to FIGS. 18A and 18B, the S0 and S1 bits are for selecting the power level at which the analog block is to be run. The R1 and R2 bits are for selecting the REF input 130 (FIG. 9) or 101 (FIG. 10). The OS bit is to enable output onto the analog bus for the column of analog blocks, as described in conjunction with FIG. 17. The CS bit is analogous to the CEN bit of FIG. 17.

FIG. 19 is a schematic diagram showing one embodiment of a comparator cell 190 in accordance with the present invention. FIG. 20 is a schematic diagram showing one embodiment of a comparator connection 200 including comparator cell 190 in accordance with the present invention. As described in conjunction with FIGS. 17, 18A and 18B, the value of the CEN or CS bit determines whether the output of comparator cell 190 is allowed to reach the digital bus (CBUS) 24.

FIGS. 21A, 21B, 21C, 21D, 21E, 21F, 21G and 21H are exemplary applications using continuous time blocks (e.g., continuous time block 40 of FIG. 4) in accordance with the present invention. Other applications may be possible. Circuit 211a is a non-inverting gain application, circuit 211b is a non-inverting loss application, circuit 211c is an inverting amplifier application, circuit 211d is a comparator/uncontrolled op-amp application, circuit 211e is one type of compare to a four-bit digital to analog converter (DAC), circuit 211f is another type of compare to four-bit DAC, circuit 211g is a compare to scaled input application, and circuit 211h is a four-bit DAC.

FIGS. 22A, 22B, 22C, 22D, 22E, 22F, 22G, 22H, 22I, 22J and 22K are exemplary applications using switched capacitor blocks (e.g., switched capacitor blocks 90 and 100 of FIGS. 9 and 10, respectively) in accordance with the present invention. Other applications are possible. Circuit 221a is a delta-sigma modulator with correlated double sampling for 1/f noise reduction (the comparator cell 190 of FIG. 19 is not shown). Circuit 221b is an analog portion of an incremental analog-to-digital converter (the comparator cell 190 of FIG. 19 is not shown). Circuit 221c is a five-bit non-inverting DAC. Circuit 221d is a five-bit inverting DAC. Circuit 221e implements subtraction of CA inputs 131 and CB inputs 140. Circuit 221f implements addition of CA inputs 131 and CB inputs 140. Circuit 221g is for modulation from a digital configurable system module (DCSM) 222 (DCSMs are described in the provisional application referenced above). Circuit 221h is a switched capacitor integrator. Circuit 221i implements a gain of 31/16 (not quite two). Circuit 221j is a switched capacitor comparator. Circuit 221k is a charge redistribution comparator.

Figure 23:
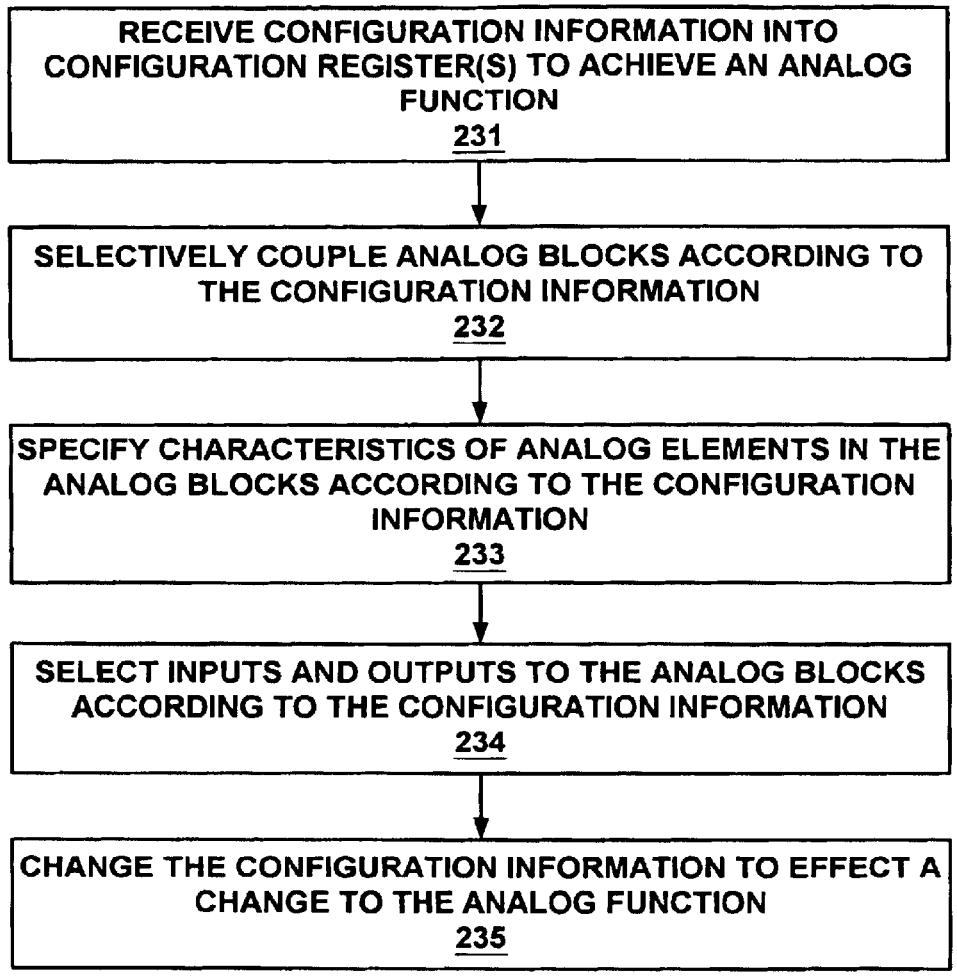
FIG. 23 is a flowchart of the steps in a process for programming and configuring a multi-functional device in accordance with various embodiments of the present invention.

FIG. 23 is a flowchart of the steps in a process 230 for programming and configuring a multi-functional device (e.g., microcontroller 10 of FIG. 1) in accordance with the various embodiments of the present invention. Although specific steps are disclosed in process 230, such steps are exemplary. That is, the present invention is well suited to performing various other steps or variations of the steps recited in process 230. It is appreciated that the steps in process 230 may be performed in an order different than presented, and that not all of the steps in process 230 may be performed.

In step 231 of FIG. 23, configuration information is received into the configuration register (or registers) for each analog block 21a–l (FIG. 2). In one embodiment, up to four configuration registers are used for each analog block (see FIGS. 17, 18A and 18B). Configuration information is realized as a set of data in flash ROM 16 (FIG. 1) which is loaded into the configuration registers at boot time. Because the information in the configuration registers can be dynamically changed, configuration information can also be loaded during program execution subsequent to boot time.

In step 232 of FIG. 23, in the present embodiment, analog blocks 21a–l are selectively and electrically coupled according to the information in the configuration registers. That is, certain of the analog blocks 21a–l are electrically coupled in a particular combination to achieve a particular analog function, while other analog blocks are bypassed (not included in the combination).

In step 233, in the present embodiment, characteristics of the analog elements of each of the analog blocks 21a–l (or the subset of analog blocks selectively coupled in step 232) are specified according to the information in the configuration registers to achieve the particular analog function. For example, bit(s) are set in the configuration register (or registers) of an analog block to: include a compensating capacitor for a comparator function or to bypass the compensating capacitor; specify a power level; specify a resistance value of a resistor; specify a capacitance of a capacitor; change the phase of an input; select a clock phase for sampling an input; and/or control a switch.

In step 234, in the present embodiment, inputs and outputs to the analog blocks 21a–l (or the subset of analog blocks selectively coupled in step 232) are specified according to the information in the configuration registers. Note that this step may be integrated with step 232, such that by specifying the inputs and outputs to each of the analog blocks, selected analog blocks are electrically coupled while others are bypassed.

In step 235, the configuration information can be dynamically changed, either at a subsequent boot time or during program execution. By changing the configuration information, some aspect of the analog function already in place can be changed (e.g., parameterization); for example, characteristics of one or more analog elements can be changed within the combination of analog blocks selected in step 232. Similarly, by changing the configuration information, the analog blocks 21a–l can be selectively and electrically coupled in a different combination to perform a different analog function (e.g., personalization). Of course, parameterization and personalization of the analog blocks can be performed in combination.

In summary, the present invention provides an analog system methodology and architecture that introduces a single chip solution that contains a set of tailored analog blocks and elements that can be dynamically configured and reconfigured in different ways to implement a variety of different analog functions. Configuration registers define the type of function to be performed, the way in which the analog blocks are to be coupled, the inputs and outputs of the analog blocks, and the characteristics of the analog elements. The configuration registers can be dynamically programmed.

In one embodiment, each analog block has up to four registers for programming block functions, coefficient values, routing to and from peripherals, and routing to and from other blocks. The block functions are programmed by enabling certain parts of the circuit by closing appropriate switches in response to user programming of the register values. The coefficients are programmed by selecting the values (characteristics) of passive circuit elements in response to the register values. The passive elements include capacitors (in switched capacitor blocks) and resistors (in continuous time blocks). The desired routing is realized by enabling selected switches.

The present invention thus provides a microcontroller solution that is suited for a variety of applications and therefore can reduce development time and expenses. The present invention facilitates the design of customized chips (integrated circuits and microcontrollers) at reduced costs. As a single chip that can be produced in quantities and customized for a variety of functions and applications, designers are not subjected to the volume requirements needed to make contemporary designs viable. To further reduce development time and expenses, pre-designed (personalized) combinations of analog blocks ("user modules") can be provided to designers.

The preferred embodiment of the present invention, programming methodology and architecture for a programmable analog system, is thus described. While the present invention has been described in particular embodiments, it should be appreciated that the present invention should not be construed as limited by such embodiments, but rather construed according to the following claims.

What is claimed is:

1. A method for implementing multiple functions in a device, said method comprising:
   a) receiving configuration information into a configuration register of said device, said device comprising a plurality of analog blocks interconnected in a single integrated circuit, wherein each analog block in said plurality of analog blocks is selectively and electrically couplable to and decouplable from other analog blocks in said plurality of analog blocks, wherein said configuration information is for selectively and electrically coupling a particular combination of said analog blocks in a particular configuration according to an analog function to be performed; and
   b) electrically coupling selected analog blocks according to said configuration information to achieve said analog function, wherein said configuration information is implemented by said analog blocks to accomplish said coupling.

2. The method of claim 1 comprising:
   changing dynamically said configuration information to achieve a different analog function.

3. The method of claim 1 wherein said configuration information in said configuration register is for specifying inputs and outputs of each of said analog blocks according to said analog function.

4. The method of claim 1 wherein an analog block comprises a plurality of analog elements having changeable characteristics, wherein said configuration information in said configuration register is for specifying characteristics of said analog elements according to said analog function.

5. The method of claim 1 wherein the step of receiving configuration information is performed during bootup of a system comprising said device.

6. The method of claim 1 wherein the step of receiving configuration information is performed during program execution subsequent to bootup of a system comprising said device.

7. The method of claim 1 wherein said plurality of analog blocks comprises switched capacitor blocks.

8. The method of claim 1 wherein said plurality of analog blocks comprises continuous time blocks.

9. The method of claim 1 comprising:

storing an address for said configuration register in a register bank.

10. A method for configuring a device, said method comprising:

a) receiving configuration information into a configuration register of said device, said device comprising a first analog block comprising a plurality of analog elements having changeable characteristics, wherein said configuration information is for specifying characteristics of said analog elements according to an analog function to be performed and wherein said configuration information is also for selectively and electrically coupling and decoupling said first analog block to and from a second analog block of said device according to said analog function;

b) setting said characteristics of said analog elements according to said configuration information to achieve said analog function, c) programming said first analog block according to said configuration information to route signals from said first analog block to said second analog block.

11. The method of claim 10 comprising:

changing dynamically said configuration information to achieve a different analog function.

12. The method of claim 10 wherein said configuration information in said configuration register is for specifying inputs and outputs of said first analog block according to said analog function.

13. The method of claim 10 wherein said first analog block is a switched capacitor block.

14. The method of claim 10 wherein said first analog block is a continuous time block.

15. The method of claim 10 wherein the step of receiving configuration information is performed during bootup of a system comprising said first analog block.

16. The method of claim 10 wherein the step of receiving configuration information is performed during program execution subsequent to bootup of a system comprising said first analog block.

17. The method of claim 10 comprising:

storing an address for said configuration register in a register bank.

18. The method of claim 10 wherein said step b) comprises:

setting a bit in said configuration register to a first value to include a compensating capacitor when said first analog block is to perform a comparator function and to a second value to bypass said compensating capacitor.

19. The method of claim 10 wherein said step b) comprises:

setting bits in said configuration register to specify a power level for said first analog block.

20. The method of claim 10 wherein said step b) comprises:

setting bits in said configuration register to specify a resistance of a resistor in said first analog block.

21. The method of claim 10 wherein said step b) comprises:

setting bits in said configuration register to specify a capacitance of a capacitor in said first analog block.

22. The method of claim 10 wherein said step b) comprises:

setting a bit in said configuration register to change the phase of an input to said first analog block.

23. The method of claim 10 wherein said step b) comprises:

setting a bit in said configuration register to select a clock phase for sampling an input to said first analog block.

24. The method of claim 10 wherein said step b) comprises:

setting a bit in said configuration register to control a gated switch in said first analog block.

25. A method for configuring a device comprising a plurality of analog blocks coupled in a single integrated circuit, said method comprising:

a) receiving configuration information into a configuration register of said device, wherein said configuration information is for causing a first analog block of said device to be selectively and electrically coupled to a second analog block of said device according to an analog function to be performed, said configuration information for configuring said first analog block to route a signal to said second analog block, said configuration information also for specifying analog characteristics of said first and second analog blocks; and b) changing dynamically said configuration information to effect a change to said analog function.

26. The method of claim 25 comprising:

coupling electrically first selected analog blocks according to first configuration information in said configuration register to achieve a first analog function;

setting characteristics of said first selected analog blocks according to said first configuration information to achieve said first analog function;

changing in said configuration register said first configuration information to second configuration information;

coupling electrically second selected analog blocks according to said second configuration information to achieve a second analog function; and setting characteristics of said second selected analog blocks according to said second configuration information to achieve said second analog function.

27. The method of claim 26 further comprising:

selecting inputs and outputs of each of said first selected analog blocks according to said first analog function; and selecting inputs and outputs of each of said second selected analog blocks according to said second analog function.

28. The method of claim 25 wherein said plurality of analog blocks comprises switched capacitor blocks and continuous time blocks.

* * * * *